United States Patent
Kim et al.

(10) Patent No.: US 10,201,083 B2
(45) Date of Patent: *Feb. 5, 2019

(54) PRINTED CIRCUIT BOARD AND DISPLAY APPARATUS INCLUDING THE SAME

(71) Applicant: Samsung Display Co., Ltd., Yongin-Si, Gyeonggi-Do (KR)

(72) Inventors: Byoungyong Kim, Seoul (KR); Inseok Yeo, Seoul (KR); Euiyun Jang, Seoul (KR); Sangjun Lee, Ansan-si (KR); Jeongho Hwang, Cheonan-si (KR)

(73) Assignee: Samsung Display Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/367,070

(22) Filed: Dec. 1, 2016

(65) Prior Publication Data

US 2017/0164474 A1 Jun. 8, 2017

(30) Foreign Application Priority Data

Dec. 4, 2015 (KR) .................. 10-2015-0172635
Dec. 14, 2015 (KR) .................. 10-2015-0178353

(51) Int. Cl.
*H05K 1/11* (2006.01)
*H05K 1/18* (2006.01)
*H05K 1/14* (2006.01)

(52) U.S. Cl.
CPC .............. *H05K 1/113* (2013.01); *H05K 1/111* (2013.01); *H05K 1/118* (2013.01); *H05K 1/181* (2013.01); *H05K 1/147* (2013.01); *H05K 2201/05* (2013.01); *H05K 2201/09227* (2013.01); *H05K 2201/09409* (2013.01);
(Continued)

(58) Field of Classification Search
CPC ......... H05K 1/111–1/113; H05K 1/118; H05K 2201/09409–2201/09427; H05K 2201/09709
See application file for complete search history.

(56) References Cited

U.S. PATENT DOCUMENTS

2004/0159930 A1 8/2004 Makita et al.
2004/0242027 A1* 12/2004 Tanokura ................ H01L 24/06
                                                                439/60
(Continued)

FOREIGN PATENT DOCUMENTS

JP     H09326413 A     12/1997
JP     2004-095756 A    3/2004
(Continued)

*Primary Examiner* — Hoa C Nguyen
(74) *Attorney, Agent, or Firm* — Innovation Counsel LLP

(57) ABSTRACT

Provided is a printed circuit board including a base substrate, first row pads, and second row pads. The base substrate has two sides, that can be adjacent, respectively extending in first and second directions. A plurality of pad group areas successively positioned along the first direction are defined on the base substrate. The first row pads are respectively disposed within the pad group areas and successively positioned along a third direction. The second row pads are respectively disposed within the pad group areas, successively positioned along the third direction, and spaced apart from the first row pads. Each of the second row pads is a predetermined distance from a corresponding one of the first row pads in the second direction.

16 Claims, 24 Drawing Sheets

(52) U.S. Cl.
CPC ............ *H05K 2201/09481* (2013.01); *H05K 2201/09709* (2013.01); *H05K 2201/10128* (2013.01); *H05K 2201/10545* (2013.01); *Y02P 70/611* (2015.11)

(56) References Cited

U.S. PATENT DOCUMENTS

| | | |
|---|---|---|
| 2005/0046033 A1 | 3/2005 | Chung et al. |
| 2005/0127493 A1* | 6/2005 | Yuzawa ............ H01L 23/49838 257/692 |
| 2006/0185895 A1* | 8/2006 | Kalidas ............ H01L 23/49838 174/261 |
| 2009/0184418 A1 | 7/2009 | Hwang et al. |
| 2014/0239317 A1 | 8/2014 | Bang et al. |
| 2014/0327148 A1 | 11/2014 | Lim et al. |
| 2015/0076531 A1 | 3/2015 | Kim |
| 2015/0262906 A1 | 9/2015 | Kim et al. |

FOREIGN PATENT DOCUMENTS

| | | |
|---|---|---|
| JP | 2004-356339 A | 12/2004 |
| KR | 10-2008-0002336 A | 1/2008 |
| KR | 10-2008-0085443 A | 9/2008 |
| KR | 10-2014-0067762 A | 6/2014 |

\* cited by examiner

PRINTED CIRCUIT BOARD AND DISPLAY APPARATUS INCLUDING THE SAME

CROSS-REFERENCE TO RELATED APPLICATIONS

This U.S. non-provisional patent application claims priority under 35 U.S.C. § 119 of Korean Patent Application Nos. 10-2015-0172635 filed on Dec. 4, 2015, and 10-2015-0178353 filed on Dec. 14, 2015, the entire contents of which are hereby incorporated by reference.

BACKGROUND

The present disclosure herein relates generally to printed circuit boards, and more specifically to printed circuit boards and display apparatuses including the same.

Many electronic devices include multiple electronic components. For example, an electronic device such as a portable phone, a notebook computer, or a television includes a display panel generating an image, a main line board, and a flexible printed circuit board.

Two electronic components are often electrically connected to each other. The two electronic components can be electrically connected to each other through coupling of pad parts. A process of electrically connecting the pad parts of the two electronic components to each other (hereinafter, referred to as a bonding process) includes a process of aligning and coupling the pad parts of the two electronic components. In the coupling of the pad parts, a thermal compression tool may be used.

When the display apparatus has high resolution, the number of pads for transmitting and receiving a signal may increase. When the number of pads increases, a non-display area on each of the display panel and the flexible printed circuit board may also increase.

SUMMARY

The present disclosure provides a display apparatus including a printed circuit board and a display panel, each of which has a reduced area on which pads are disposed.

The present disclosure also provides a display apparatus including a printed circuit board and a display panel on which more pads are disposed on a limited area.

The present disclosure also provides a display apparatus that is capable of preventing a flexible line board and a display panel from being twisted when a bonding process is performed.

An embodiment of the inventive concept provides a printed circuit board including a base substrate, first row pads, and second row pads.

The base substrate may have two sides respectively extending in first and second directions. A plurality of pad group areas arranged in the first direction may be defined on the base substrate.

The first row pads may be respectively disposed within the pad group areas and successively positioned along a third direction.

The second row pads may be respectively disposed within the pad group areas, successively positioned along the third direction, and spaced apart from the first row pads.

Each of the pad group areas may be divided into first to third pad areas that are sequentially disposed along the second direction. A portion of the first row pads may be disposed on the first pad area, the rest of the first row pads and a portion of the second row pads may be disposed on the second pad area, and the rest of the second row pads may be disposed in the third pad area.

In an embodiment, each of the second row pads may be spaced apart from a corresponding one of the first row pads by a predetermined distance.

In an embodiment, the first row pads and the second row pads may be disposed on the same layer.

In an embodiment, the printed circuit board may further include via lands, via patterns, and a driving circuit chip.

In an embodiment, the via lands may be disposed on a first surface of the base substrate.

In an embodiment, the via patterns may overlap the via lands and pass through the base substrate.

In an embodiment, a driving circuit chip may be disposed on a second surface of the base substrate, the second surface facing the first surface. The driving circuit chip may be electrically connected to the first row pads and the second row pads.

In an embodiment, the first row pads may be disposed on the second surface of the base substrate. The second row pads may be disposed to overlap the via patterns on the second surface of the base substrate, and each of the second row pads may be electrically connected to the driving circuit chip through one of the via lands and one of the via patterns.

In an embodiment, each of the second row pads may have an area greater than that of its corresponding one the via land.

In an embodiment, the first to third pad areas may extend in the first direction and be divided by two virtual lines spaced apart from each other.

In an embodiment, one first row pad of the first row pads may have a first shape, and another first row pad of the first row pads may have a second shape different from the first shape.

In an embodiment of the inventive concept, a display apparatus includes a printed circuit board and a display panel.

The printed circuit board may have two sides respectively extending in first and second directions. A plurality of pad group areas successively positioned along the first direction may be present on the printed circuit board.

The display panel may be electrically connected to the printed circuit board through the pad group areas.

The printed circuit board may include first row pads and second row pads. The first row pads may be respectively disposed within the pad group areas and successively positioned along a third direction. The second row pads may be respectively disposed within the pad group areas, successively positioned along the third direction, and spaced apart from the first row pads.

Each of the pad group areas may be divided into first to third pad areas that are sequentially disposed along the second direction. A portion of the first row pads may be disposed on the first pad area, the rest of the first row pads and a portion of the second row pads may be disposed on the second pad area, and the rest of the second row pads may be disposed in the third pad area.

In an embodiment, the display panel may include first row panel pads and second row panel pads.

In an embodiment, the first row panel pads may overlap respective first row pads, and the second row panel pads may overlap respective second row pads.

In an embodiment, a portion of the first row panel pads may be disposed on the first pad area, the rest of the first row panel pads and a portion of the second row panel pads may be disposed on the second pad area, and the rest of the second row panel pads may be disposed on the third pad area.

In an embodiment of the inventive concept, a printed circuit board includes a base substrate, first row pads, and second row pads.

The base substrate may have two sides respectively extending in first and second directions. A plurality of pad group areas successively positioned along the first direction may be defined on the base substrate.

The first row pads may be respectively disposed within the pad group areas and arranged in a third direction.

The second row pads may be respectively disposed within the pad group areas, successively positioned along the third direction, and spaced apart from the first row pads.

Each of the second row pads may be spaced apart from a corresponding one of the first row pads by a predetermined distance in the second direction.

In an embodiment of the inventive concept, a printed circuit board includes a base substrate, diagonal pad groups, and crossing pad groups.

The base substrate may have two sides respectively extending in first and second directions. A plurality of pad group areas may be successively positioned along the first direction on the base substrate.

Each of the diagonal pad groups may be disposed within a first pad group area. Each of the crossing pad groups may be disposed within a second pad group area.

Each of the diagonal pad groups may include first row diagonal pads arranged in a third direction and second row diagonal pads arranged in the third direction and spaced apart from the first row diagonal pads.

Each of the crossing pad groups may include first row crossing pads arranged in a fourth direction, and second row crossing pads arranged in the fourth direction and spaced apart from the first row crossing pads.

Each of the pad group areas may be divided into first to third pad areas sequentially disposed along the second direction.

A portion of the first row diagonal pads may be disposed in the first pad areas of the first pad group areas, the rest of the first row diagonal pads and a portion of the second row diagonal pads may be disposed in the second pad areas of the first pad group areas, and the rest of the second row diagonal pads may be disposed in the third pad areas of the first pad group areas.

A portion of the first row crossing pads may be disposed in the first pad areas of the second pad group areas, the rest of the first row crossing pads and a portion of the second row crossing pads may be disposed in the second pad areas of the second pad group areas, and the rest of the second row crossing pads may be disposed in the third pad areas of the second pad group areas.

In an embodiment, one of the diagonal pad groups and one of the crossing pad groups may be symmetrically disposed with respect to a virtual line extending in the second direction.

In an embodiment, the third and fourth directions may be symmetric with respect to a virtual line extending in the second direction.

In an embodiment, the pad group areas may include initial to n-th pad group areas that are sequentially disposed along the first direction In an embodiment, the diagonal pad groups may be disposed within the initial to n/2-th pad group areas, respectively. The crossing pad groups may be disposed within the (n/2+1)-th to n-th pad group areas, respectively.

In an embodiment, the diagonal pad groups and the crossing pad groups may be disposed in alternating manner along the first direction.

In an embodiment of the inventive concept, a display apparatus includes a printed circuit board and a display panel.

The printed circuit board may have two sides respectively extending in first and second directions. A plurality of pad group areas are successively positioned along the first direction.

The display panel may be electrically connected to the printed circuit board through the pad group areas.

The printed circuit board may include diagonal pad groups and crossing pad groups.

Each of the diagonal pad groups may be disposed within a first pad group area. Each of the crossing pad groups may be disposed within a second pad group area.

Each of the diagonal pad groups may include first row diagonal pads arranged in a third direction, and second row diagonal pads arranged in the third direction and spaced apart from the first row diagonal pads.

Each of the crossing pad groups may include first row crossing pads arranged in a fourth direction, and second row crossing pads arranged in the fourth direction and spaced apart from the first row crossing pads.

Each of the pad group areas may be divided into first to third pad areas sequentially disposed along the second direction.

A portion of the first row diagonal pads may be disposed on the first pad areas of the first pad group areas, the rest of the first row diagonal pads and a portion of the second row diagonal pads may be disposed in the second pad areas of the first pad group areas, and the rest of the second row diagonal pads may be disposed in the third pad areas of the first pad group areas.

A portion of the first row crossing pads may be disposed in the first pad areas of the second pad group areas, the rest of the first row crossing pads and a portion of the second row crossing pads may be disposed in the second pad areas of the second pad group areas, and the rest of the second row crossing pads may be disposed in the third pad areas of the second pad group areas.

In an embodiment, the display apparatus may include diagonal panel pad groups and crossing panel pad groups.

In an embodiment, the diagonal panel pad groups may respectively overlap the diagonal pad groups. The crossing panel pad groups may respectively overlap the crossing pad groups.

In an embodiment, each of the diagonal panel pad groups may include first row diagonal panel pads respectively overlapping the first row diagonal pads, and second row diagonal panel pads respectively overlapping the second row diagonal pads.

In an embodiment, each of the crossing panel pad groups may include first row crossing panel pads respectively overlapping the first row crossing pads, and second row crossing panel pads respectively overlapping the second row crossing pads.

In an embodiment, the first row diagonal panel pads may be arranged along the third direction, and the second row diagonal panel pads are arranged along the third direction. The first row crossing panel pads may be arranged along the fourth direction, and the second row crossing panel pads are arranged along the fourth direction.

In an embodiment, a portion of the first row diagonal panel pads may be disposed in the first pad areas of the first pad group areas, the rest of the first row diagonal panel pads and a portion of the second row diagonal panel pads may be disposed in the second pad areas of the first pad group areas, and the rest of the second row diagonal panel pads may be disposed in the third pad areas of the first pad group areas.

In an embodiment, a portion of the first row crossing panel pads may be disposed in the first pad areas of the second pad group areas, the rest of the first row crossing panel pads and a portion of the second row crossing panel pads may be disposed in the second pad areas of the second pad group areas, and the rest of the second row crossing panel pads may be disposed in the third pad areas of the second pad group areas.

In an embodiment, one of the diagonal pad groups and one of the crossing pad groups may be symmetrically disposed with respect to a virtual line extending in the second direction.

In an embodiment, one of the diagonal panel pad groups and one of the crossing panel pad groups may be symmetrically disposed with respect to a virtual line extending in the second direction.

In an embodiment, the third and fourth directions may be symmetric with respect to a virtual line extending in the second direction.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
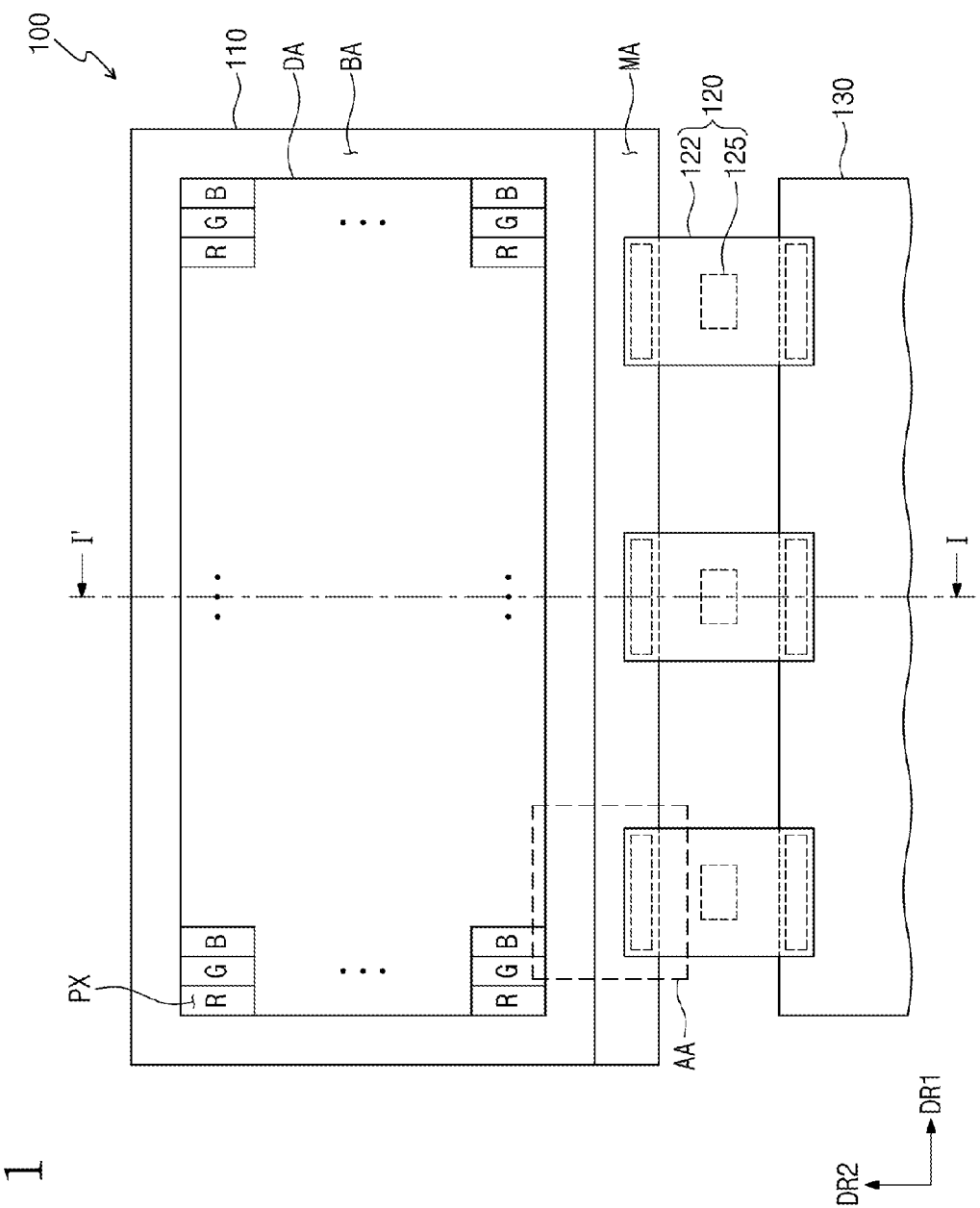
FIG. 1 is a plan view of a display apparatus according to an embodiment of the inventive concept.

Since the present disclosure may have diverse modified embodiments, specific embodiments are illustrated in the drawings and are described in the detailed description of the inventive concept. However, this does not limit the present disclosure within specific embodiments and it should be understood that the present disclosure covers all the modifications, equivalents, and replacements within the idea and technical scope of the inventive concept. The various figures are not necessarily to scale. All numerical values are approximate, and may vary. All examples of specific materials and compositions are to be taken as nonlimiting and exemplary only. Other suitable materials and compositions may be used instead.

Hereinafter, preferred embodiments of the inventive concept will be described below in more detail with reference to the accompanying drawings.

Figure 2:
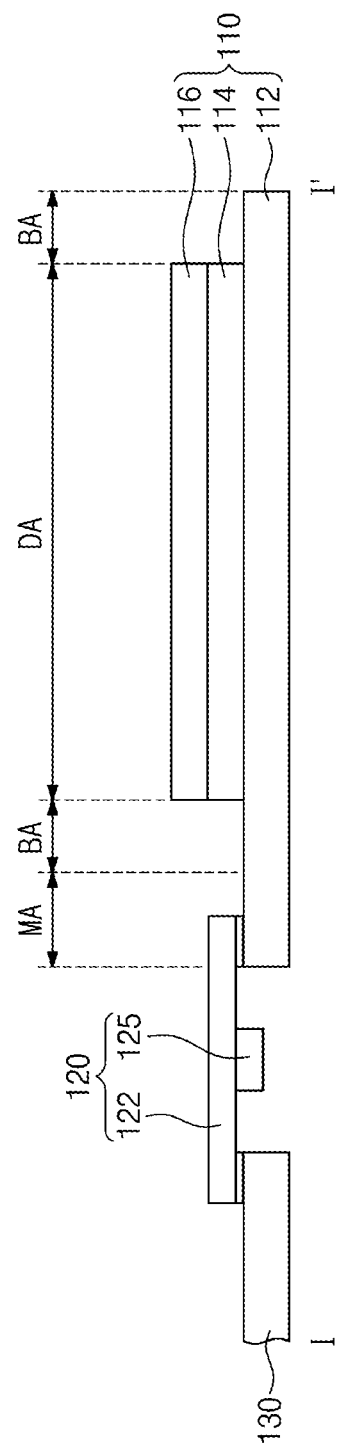
FIG. 2 is a cross-sectional view taken along line I-I' of FIG. 1.

FIG. 1 is a plan view of a display apparatus accordance with an embodiment of the inventive concept, and FIG. 2 is a cross-sectional view taken along line I-I' of FIG. 1.

Referring to FIGS. 1 and 2, a display apparatus 100 according to an embodiment of the inventive concept includes a display panel 110, a flexible printed circuit board 120, and a main driving board 130. The display panel 110, the flexible printed circuit board 120, and the main driving board 130 are electrically connected to each other.

The display panel 110 may display a desired image by applying a driving signal to a plurality of pixels PX. The plurality of pixels PX may be disposed in a matrix form in first and second directions DR1 and DR2, which can be perpendicular to each other. In an embodiment of the inventive concept, the pixels PX may include first to third pixels that respectively display a red color R, a green color G, and a blue color B. In an embodiment of the inventive concept, the pixels PX may further include a portion of pixels (not shown) that display white, cyan, and magenta, or any other desired colors. The plurality of pixels PX may be defined as a display unit of the display panel 110.

The display panel 110 may be classified into a liquid crystal panel, an organic light emitting display panel, and an electrowetting display panel according to the type of pixels PX employed. In the current embodiment, the display panel 110 may be the organic light emitting display panel.

The display panel may be divided into a display area DA on which the plurality of pixels PX are disposed, a non-display area BA surrounding the display area DA, and a mounting area MA to which the flexible printed circuit board 120 is coupled. In an embodiment of the inventive concept, the non-display area BA and the mounting area MA may not be divided, i.e. may both be the same area. The non-display area BA may be omitted, or the mounting area MA may be a portion of the non-display area BA.

As illustrated in FIG. 2, the display panel 110 may include a display substrate 112, a display device layer 114 disposed on the display substrate 112, and an encapsulation layer 116 disposed on the display device layer 11. The display substrate 112 may include a substrate and a plurality of insulation layers, functional layers, and conductive layers, which can be disposed on the substrate in known manner. The conductive layers may include gate lines (not shown), data lines (not shown), and other signal lines. Also, the conductive layers may include pad parts (not shown) connected to the lines. The lines provide a driving signal to the plurality of pixels PX.

The display device layer 114 may include a plurality of insulation layers, functional layers, and conductive layers, which collectively constitute the plurality of pixels PX. The functional layers may include an organic light emitting layer. The encapsulation layer 116 may be disposed on the display device layer 114. The encapsulation layer 116 protects the display device layer 114. Although not specifically shown, in an embodiment of the inventive concept, the encapsulation layer 116 may also cover one or more side surfaces of the display device layer 114.

A black matrix (not shown) that blocks light may be disposed on the non-display area BA. A gate driving circuit (not shown) for supplying a gate signal to the plurality of pixels PX may be disposed on the non-display area BA. In an embodiment of the inventive concept, a data driving circuit may be further disposed on the non-display area BA. A pad part (not shown) for receiving a signal supplied from the flexible printed circuit board 120 may be disposed on the mounting area MA.

As illustrated in FIGS. 1 and 2, the flexible printed circuit board 120 includes a flexible line board 122 and a driving circuit chip 125. The driving circuit chip 125 is electrically connected to conductive lines of the flexible line board 122.

The flexible printed circuit board 120 may have two sides that are adjacent to each other and respectively extend in the first and second directions DR1 and DR2.

When the flexible printed circuit board 120 includes the driving circuit chip 125, the pad part (not shown) of the display panel 110 may include data pads electrically connected to the data lines and control signal pads electrically connected to the control signal lines. The data lines may be connected to the pixels PX, and the control signal lines may be connected to the gate driving circuit, as is known. Although the flexible printed circuit board 120 has a chip on film structure in the current embodiment, embodiments of the inventive concept are not limited thereto. In another embodiment, the driving circuit chip may be mounted on the non-display area BA of the display panel 110, and the flexible printed circuit board 120 may include only the flexible line board 122.

The main driving board 130 may be electrically connected to the display panel 110 through the flexible line board 122 to transmit/receive a signal to/from the driving circuit chip 125. The main driving board 130 may provide image data, a control signal, and a power voltage to the display panel 110 or the flexible printed circuit board 120. The main driving board 130 may include an active device and a passive device. The main driving board 130 may include pad parts (not shown) connected to the flexible printed circuit board 120.

Figure 3:
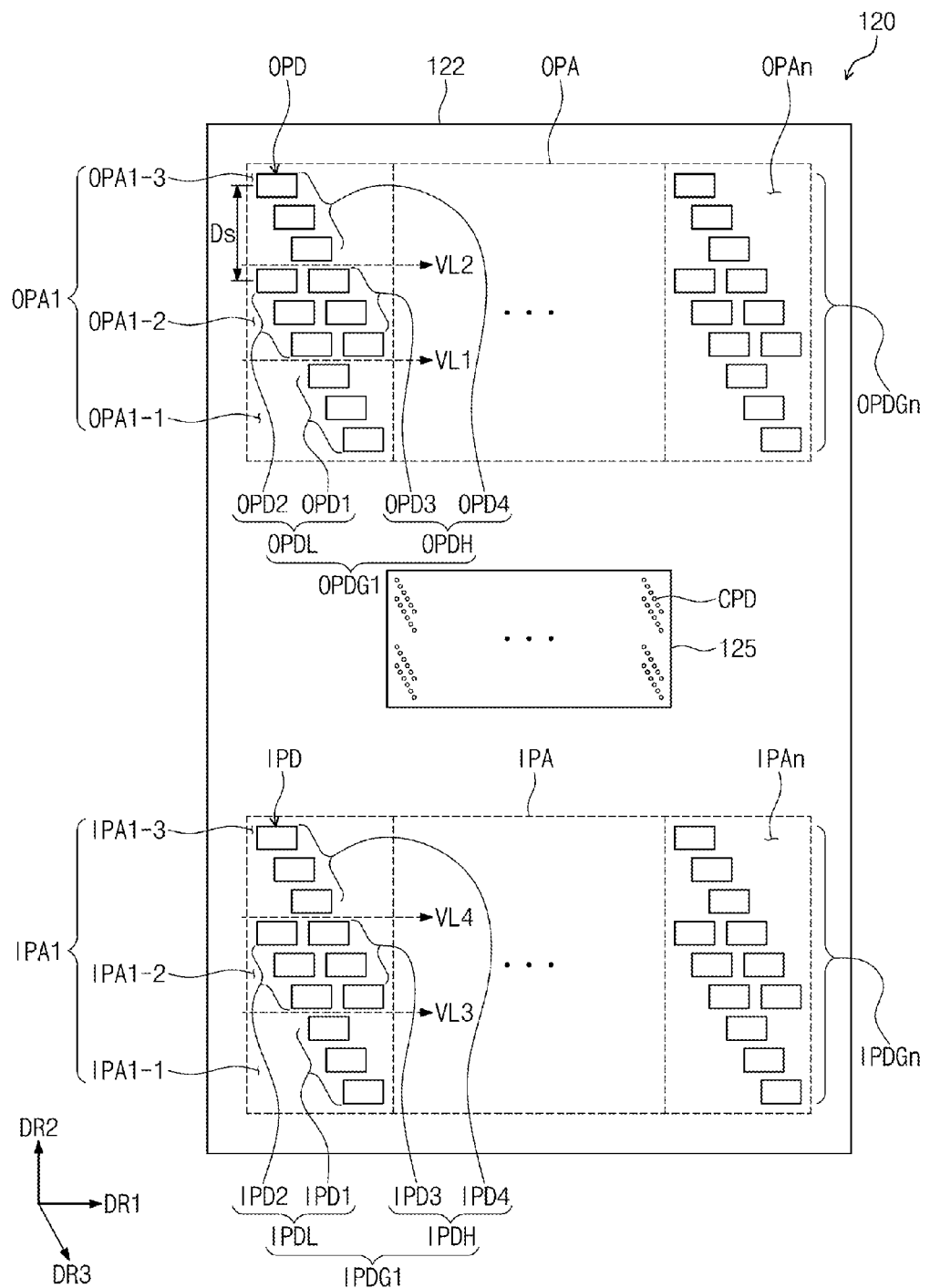
FIG. 3 is a plan view of a flexible printed circuit board according to an embodiment of the inventive concept.

FIG. 3 is a plan view of a flexible printed circuit board according to an embodiment of the inventive concept.

Referring to FIG. 3, the flexible line board 122 may include a plurality of pads OPD, IPD, and CPD, and a plurality of lines (not shown).

The plurality of pads OPD, IPD, and CPD may include connection pads CPD connected to connection terminals (not shown) of the driving circuit chip 125, input pads IPD connected to the main driving board 130, and output pads OPD connected to the display panel 110.

The connection pads CPD may be aligned to overlap both sides of the driving circuit chip 125 in the second direction DR2. In another embodiment of the inventive concept, unlike FIG. 3, the connection pads CPD may be arranged in any manner to correspond to the connection terminals of the driving circuit chip 125.

An input pad area IPA may be defined on one side of the flexible line board 122, and an output pad area OPA may be defined on the other side of the flexible line board 122. The input pad area IPA may be attached to the mounting area MA of the display panel 110. The output pad area OPA may be attached to the main driving board 130.

The input pad area IPA may be divided into a plurality of input pad group areas IPA1 to IPAn. The input pad group areas IPA1 to IPAn may be adjacent to each other in the first direction DR1. The input pad group areas IPA1 to IPAn may be divided by virtual lines extending in the second direction DR2.

The output pad area OPA may be divided into a plurality of output pad group areas OPA1 to OPAn. The output pad group areas OPA1 to OPAn may be adjacent to each other in the first direction DR1. The output pad group areas OPA1 to OPAn may be divided by virtual lines extending in the second direction DR2.

The input pads IPD may be divided into a plurality of input pad groups IPDG1 to IPDGn. The plurality of input pad groups IPDG1 to IPDGn may be disposed within the plurality of input pad group areas IPA1 to IPAn, respectively. The plurality of input pad groups IPDG1 to IPDGn may have the same pad arrangement structure as each other.

The output pads OPD may be divided into a plurality of output pad groups OPDG1 to OPDGn. The plurality of output pad groups OPDG1 to OPDGn may be disposed within the plurality of output pad group areas OPA1 to OPAn, respectively. The plurality of output pad groups OPDG1 to OPDGn may have the same pad arrangement structure as each other.

Hereinafter, a pad arrangement structure of one output pad group OPDG1 disposed within one output pad group area OPA1 will be described as an example.

The output pad group OPDG1 may include first row output pads OPDL and second row output pads OPDH.

The first row output pads OPDL may be arranged in the third direction DR3 that crosses the first and second directions DR1 and DR2. The first to third directions DR1 to DR3 may all lie within one plane. The first direction DR1 may be perpendicular to the second direction DR2, and the third direction DR3 may be inclined at an angle of about 45 degrees with respect to each of the first and second directions DR1 and DR2.

The first row output pads OPDL may be spaced a predetermined distance from each other in the third direction DR3. Each of the first row output pads OPDL may have a rectangular shape having two sides that respectively extend in the first and second directions DR1 and DR2 and are adjacent to each other. Although six first row output pads OPDL are illustrated in an embodiment of the inventive concept, the embodiment of the inventive concept is not limited thereto, and any number and arrangement of pads and rows is contemplated.

The second row output pads OPDH may be arranged in the third direction DR3. The second row output pads OPDH may be arranged parallel to the first row output pads OPDL. However, the embodiment of the inventive concept is not limited thereto. For example, the first row output pads OPDL and the second row output pads OPDH may extend in directions different from each other.

The second row output pads OPDH may be spaced a predetermined distance from each other in the third direction DR3. Each of the second row output pads OPDH may have a rectangular shape having two sides that respectively extend in the first and second directions DR1 and DR2 and are adjacent to each other. The second row output pads OPDH may be equal in number to the first row output pads OPDL, although this need not necessarily be the case. Although six second row output pads OPDH are illustrated in an embodiment of the inventive concept, the embodiment of the inventive concept is not limited thereto.

The output pad group areas OPA1 may be divided into first to third output pad areas OPA1-1, OPA1-2, and OPA1-3. The first to third output pad areas OPA1-1, OPA1-2, and OPA1-3 may be successively disposed along the second direction DR2. The first to third output pad areas OPA1-1, OPA1-2, and OPA1-3 may extend in the first direction DR1 and are divided by two virtual lines VL1 and VL2 spaced apart from each other.

Some pads OPD1 of the first row output pads OPDL may be disposed on the first output pad area OPAL-1. Other pads OPD2 of the first row output pads OPDL may be disposed on the second output pad area OPA1-2. Some pads OPD3 of the second row output pads OPDH may be disposed on the second output pad areas OPA1-2. Other pads OPD4 of the second row output pads OPDH may be disposed on the third output pad area OPA1-3.

The first row output pads OPDL may be arranged in a stair shape within one output pad group area OPA1, and the second row output pads OPDH may be arranged in a stair shape within the same output group area OPA1.

The first and second row output pads OPDL and OPDH may have the same shape within one output pad group area OPA1 Particularly, one first row output pad OPDL and one second row output pad OPDH, which are spaced apart from each other in the second direction DR2 and disposed at the same position in the first direction DR1, may have the same shape.

Respective first and second row output pads OPDL and OPDH may be disposed at the same position within one output pad group area OPA1 Each of the second row output pads OPDH may be disposed at a predetermined distance Ds from each of the respective first row output pads OPDL in the second direction DR2.

Each of the input pads IPD may have a structure similar to that of each of the output pads OPD. Hereinafter, the pad arrangement of one input pad group IPDG1 disposed within one input pad group area IPA1 will be described, as a representative example.

The input pad groups IPDG1 may include first row input pads IPDL and second row input pads IPDH. The input pad group area IPA1 may be divided into first to third input pad areas IPA1-1, IPA1-2, and IPA1-3. The first to third input pad areas IPA1-1, IPA1-2, and IPA1-3 may be sequentially arranged in the second direction DR2. The first to third input pad areas IPA1-1, IPA1-2, and IPA1-3 may divided by two virtual lines LV3 and VL4 spaced part from each other.

Some pads IPD1 of the first row input pads IPDL may be disposed on the first input pad area IPA1-1. Other pads IPD2 of the first row input pads IPDL may be disposed on the second input pad area IPA1-2. Some pads IPD3 of the second row input pads IPDH may be disposed on the second input pad area IPA1-2. Other pads IPD4 of the second row input pads IPDH may be disposed on the third input pad area IPA1-3.

According to an embodiment of the inventive concept, more pads may be disposed within the limited area of the flexible printed circuit board 120 according to various arrangements of the input and output pads IPD and OPD.

One portion of the lines (not shown) may connect the connection pads CPD to the input pads IPD, and the other lines may connect the connection pads CPD to the output pads OPD. Although not shown, the lines (not shown) may directly connect a portion of the input pads IPD to a portion of the output pads OPD. Detailed descriptions will follow below.

Figure 4:
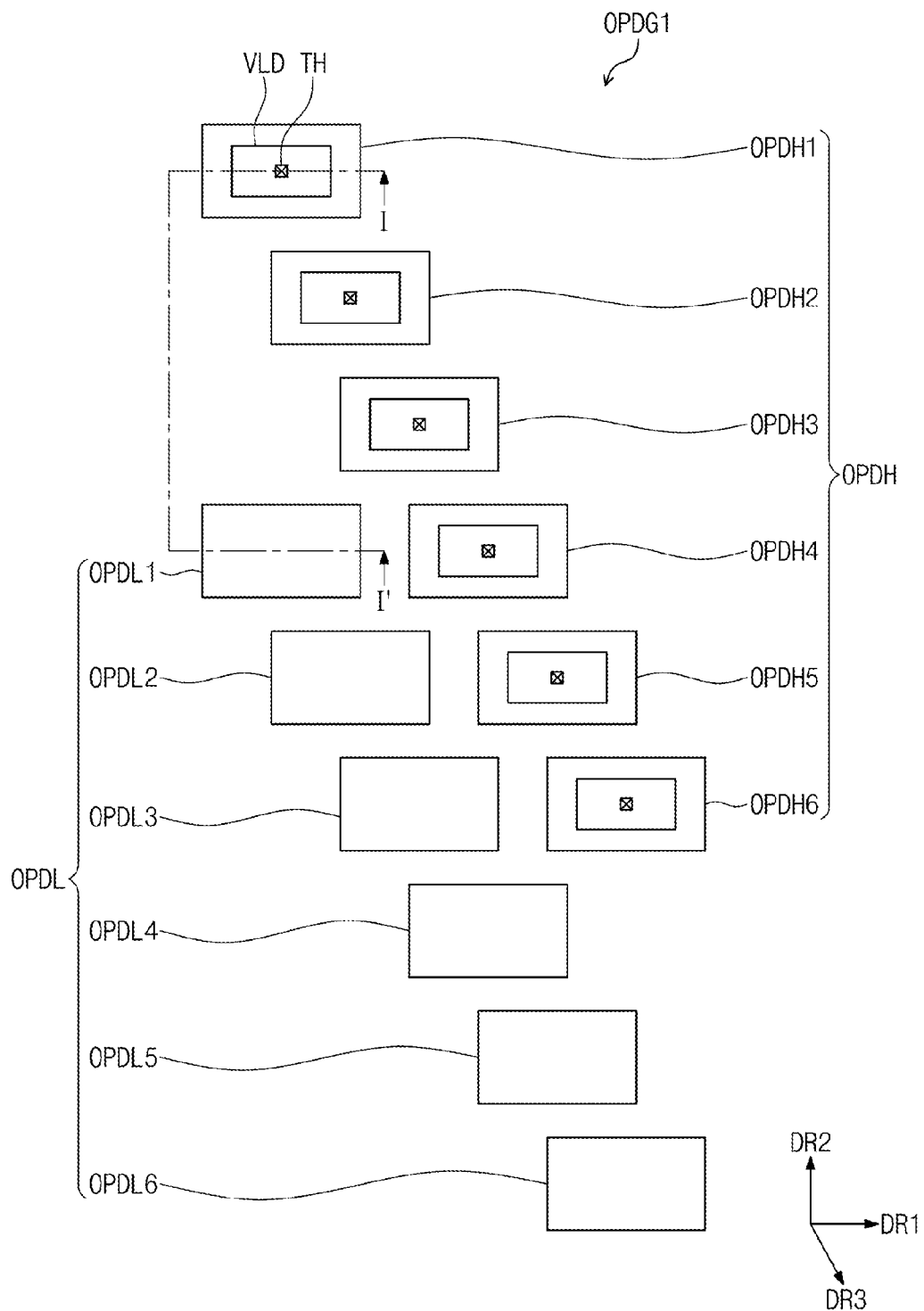
FIG. 4 is an enlarged plan view of one output pad group of FIG. 3.
Figure 5:
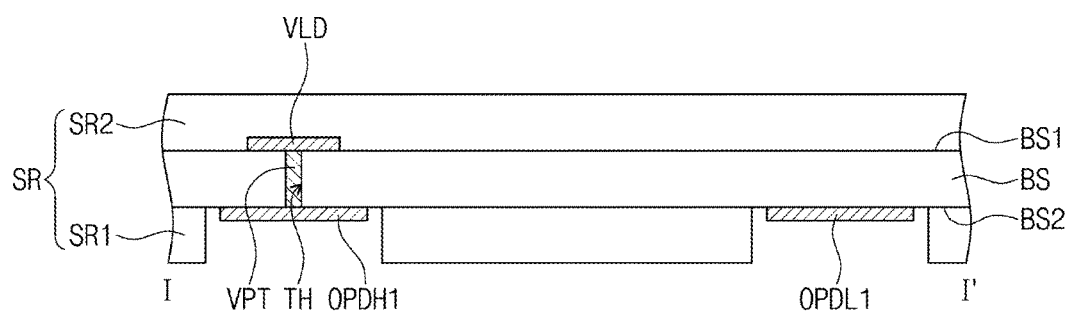
FIG. 5 is a cross-sectional view taken along line I-I' of FIG. 4.

FIG. 4 is an enlarged plan view of one output pad group OPDG1 of FIG. 3, and FIG. 5 is a cross-sectional view taken along line I-I' of FIG. 4.

One first row output pad OPDL1 and one second row output pad OPDH1 are illustrated in FIG. 5. The first row output pads OPDL have the same structure, and the second row output pads OPDH may have the same structure. Hereinafter, a structure of each of the first and second output pads OPDL1 and OPDH1 will be exemplified.

Referring to FIGS. 4 and 5, the flexible line board 122 may further include a base substrate BS, via lands VLD, via patterns VPT, and a solder resistor SR.

The base substrate BS may be formed of a flexible material, e.g., polyimide.

The plurality of pads OPD, IPD, and CPD and the plurality of lines (not shown) may be disposed on the base substrate BS. The base substrate BS may have one surface BS1 and the other surface BS2, which face each other. The input pads IPD, output pads OPD, and connection pads CPD may be disposed on the other surface BS2 of the base substrate BS. In an embodiment of the inventive concept, the input pads IPD, the output pads OPD, and the connection pads CPD may be disposed on the same layer.

The via lands VLD may be disposed on the one surface BS1 of the base substrate BS. The via lands VLD may overlap the second row output pads OPDH, respectively. In an embodiment of the inventive concept, the second row output pads OPDH may cover the corresponding via lands VLD. Each of the second row output pads OPDH may have an area greater than that of each of their corresponding via lands VLD.

Through holes TH may be defined in the base substrate BS. Each of the through holes TH may overlap one second row output pad OPDH1 and one corresponding via land VLD.

The via patterns VPT may be disposed in the through holes TH. Each of the via patterns VPT may pass through the base substrate BS to contact one of the second row output pads OPDH and its overlapping via land VLD. Each of the via patterns VPT may be formed of a conductive material to electrically connect one of the second row output pads OPDH to its corresponding via land VLD.

The solder resistor SR may include a first solder resistor SR1 and a second solder resistor SR2.

The first solder resistor SR1 may be disposed on the other surface BS2 of the base substrate BS. The first solder resistor SR1 may cover the lines (not shown) disposed on the other surface BS2 of the base substrate BS. An opening for exposing each of the input pads IPD and the outer pads OPD may be defined in the first solder resistor SR1.

The second solder resistor SR2 may be disposed on the one surface BS1 of the base substrate BS. The second solder resistor SR2 may cover the lines (not shown) disposed on the one surface BS1 of the base substrate BS.

The lines (not shown) may include input lines (not shown) and output lines (not shown). The input lines may connect the input pads IPD to the driving circuit chip 125. The output lines may connect the output pads IPD to the driving circuit chip 125. Since each of the input lines has a structure that is substantially similar to that of each of the output lines, the structure of each of the output lines will be exemplified.

The output lines may include first output lines and second output lines. The second output lines may include second upper output lines, second lower output lines, and second via patterns.

Hereinafter, the first output lines and the second lower output lines will be described with reference to FIGS. 6 and 7, and the second output lines will be described with reference to FIGS. 6 to 9.

Figure 6:
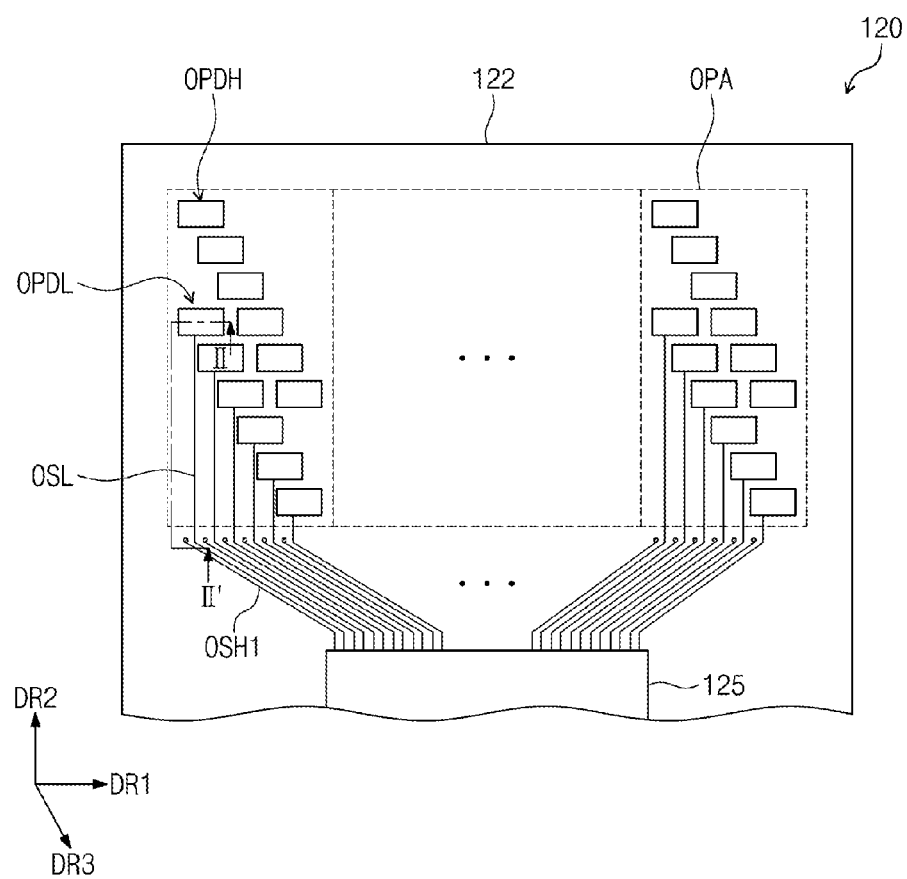
FIG. 6 is a partial plan view of the flexible printed circuit board on which first output lines and second lower output lines are illustrated.
Figure 7:
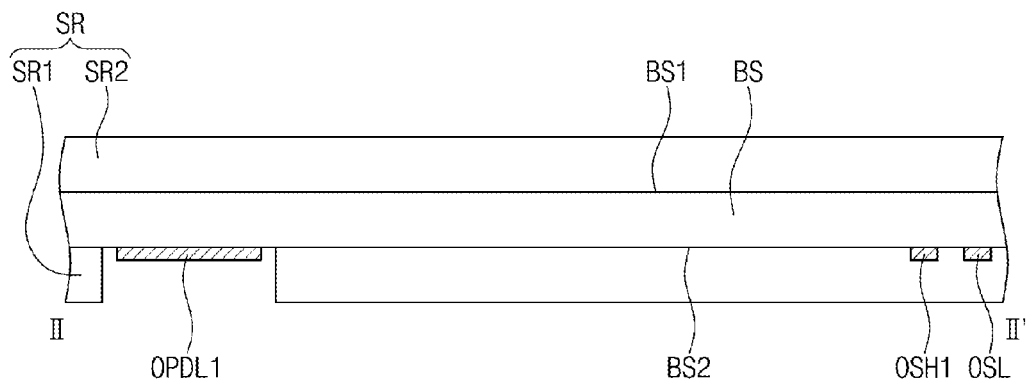
FIG. 7 is a cross-sectional view taken along line II-II' of FIG. 6.

FIG. 6 is a partial plan view of the flexible printed circuit board on which the first output lines and the second lower output lines are illustrated, and FIG. 7 is a cross-sectional view taken along line II-II' of FIG. 6.

Referring to FIGS. 6 and 7, the first output lines OSL may connect each of the first row output pads OPDL to the driving circuit chip 125. The first output lines OSL may be disposed on the other surface BS2 of the base substrate BS. The first output lines OSL may be disposed on the same layer as the first row output pads OPDL.

Each of the second lower output lines OSH1 may be connected to the driving circuit chip (see reference numeral 125 of FIG. 3). The second lower output lines OSH1 may be disposed on the other surface BS2 of the base substrate BS. The second lower output lines OSH1 may be spaced apart from the first output lines OSL and disposed on the same layer as the first output lines OSL.

Figure 8:
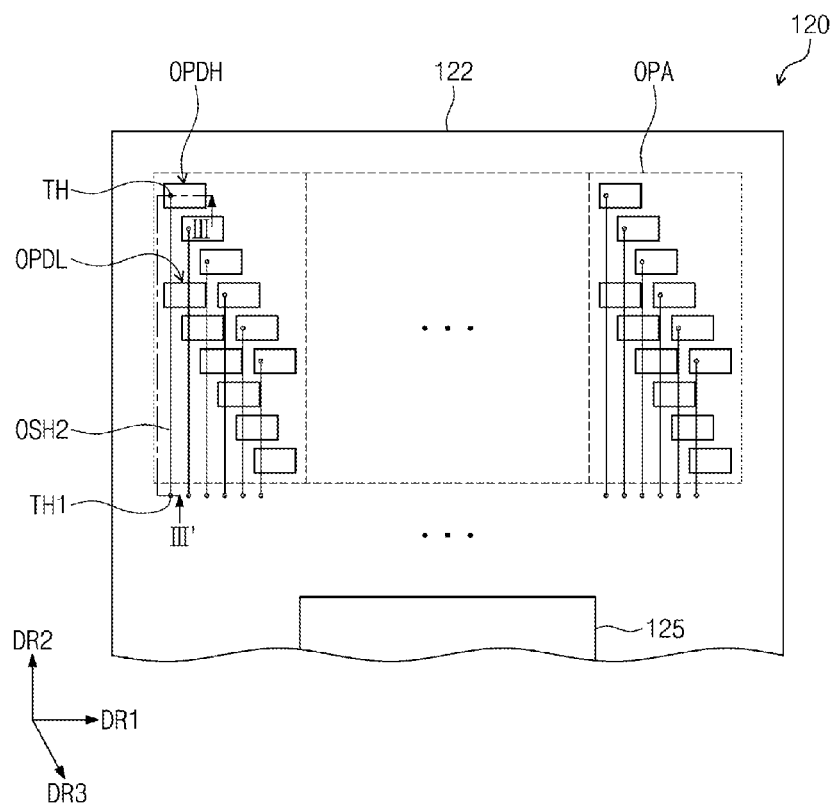
FIG. 8 is a partial plan view of the flexible printed circuit board on which second upper output lines are illustrated.
Figure 9:
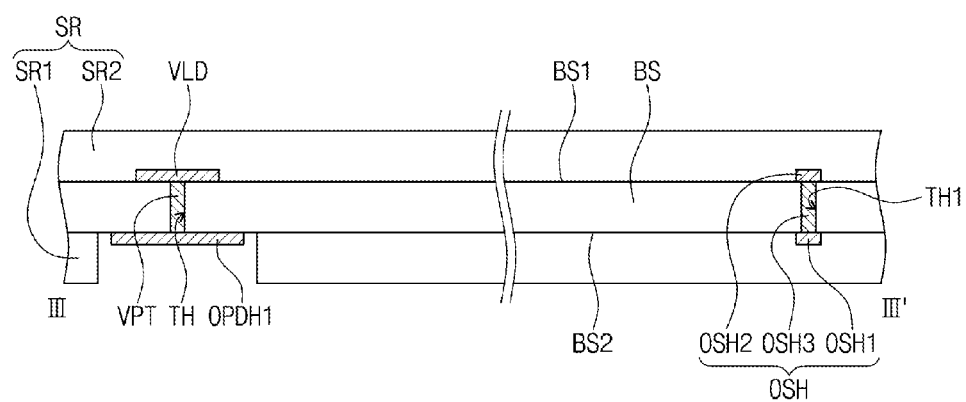
FIG. 9 is a cross-sectional view taken along line III-III' of FIG. 8.

FIG. 8 is a partial plan view of the flexible printed circuit board on which the second upper output lines are illustrated, and FIG. 9 is a cross-sectional view taken along line of FIG. 8.

Referring to FIGS. 8 and 9, the second upper output lines OSH2 may be connected to the via lands VLD, respectively. The second upper output lines OSH2 may be disposed on the one surface BS1 of the base substrate BS. The second upper output lines OSH2 may be disposed on the same layer as the via lands VLD.

Each of the second via patterns OSH3 may be disposed in each of second via through holes TH passing through the base substrate BS. The second via patterns OSH3 may connect the second lower output lines OSH1 to the second upper output lines OSH2. Each of the second via patterns OSH3 may be disposed to overlap respective second lower output lines OSH1 and respective second upper output lines OSH2.

The second row output pads OPDH may be electrically connected to the driving circuit chip 125 through the via lands VLD, the via patterns VPT, the second upper output lines OSH2, the second via patterns OSH3, and the second lower output lines OSH1.

Figure 10:
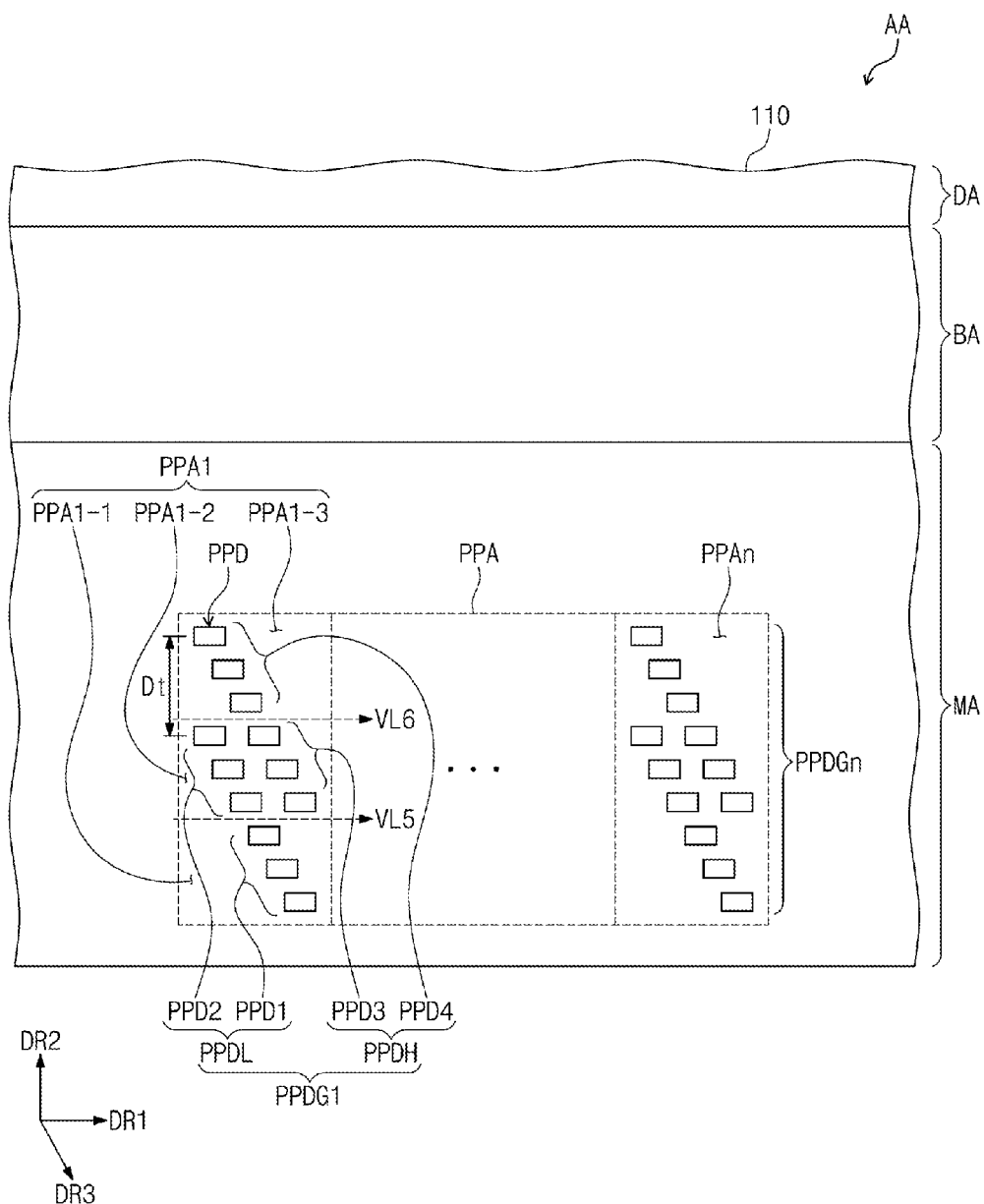
FIG. 10 is a plan view of panel pads disposed on the display panel that corresponds to an area AA of FIG. 1.

FIG. 10 is a plan view of panel pads disposed on the display panel that corresponds to an area AA of FIG. 1.

Referring to FIGS. 3 and 10, the display panel 110 may include panel pads PPD electrically connected to the output pads OPD of the flexible printed circuit board 120. Each of the panel pads PPD may be a data pad or a control signal pad.

A panel pad area PPA may be defined on the mounting area MA. In a state in which the display panel 110 and the flexible printed circuit board 120 are coupled to each other, the panel pad area PPA and the output pad area OPA may overlap each other.

The panel pad area PPA may be divided into a plurality of panel pad group areas PPA1 to PPAn. The panel pad group areas PPA1 to PPAn may be adjacent to each other in the first direction DR1. The panel pad group areas PPA1 to PPAn may be divided by virtual lines extending in the second direction DR2.

The panel pads PPD may include a plurality of panel pad groups PPDG1 to PPDGn. The plurality of panel pad groups PPDG1 to PPDGn may be disposed within the plurality of panel pad group areas PPA1 to PPAn, respectively. The plurality of panel pad groups PPDG1 to PPDGn may have the same pad arrangement structure as each other.

Hereinafter, a pad arrangement structure of one panel pad group PPDG1 disposed within one panel pad group area PPA1 will be described as an example.

The panel pad group PPDG1 may include first row panel pads PPDL and second row panel pads PPDH.

The first row panel pads PPDL may be arranged successively along the third direction DR3. The first row panel pads PPDL may be spaced a predetermined distance from each other in the third direction DR3. Each of the first row panel pads PPDL may have a rectangular shape having two sides that respectively extend in the first and second directions DR1 and DR2 and are adjacent to each other. The first row panel pads PPDL may be equal in number to the first row output pads OPDL of the flexible printed circuit board 120.

The second row panel pads PPDH may be arranged in the third direction DR3. The second row panel pads PPDH may be arranged parallel to the first row panel pads PPDL. However, the embodiment of the inventive concept is not limited thereto. For example, the first row panel pads PPDL and the second row panel pads PPDH may extend in directions different from each other according to a design error. The second row panel pads PPDH may be spaced a predetermined distance from each other in the third direction DR3. Each of the second row panel pads PPDH may have a rectangular shape having two sides that respectively extend in the first and second directions DR1 and DR2 and are adjacent to each other. The second row panel pads PPDH may be equal in number to the first row panel pads PPDL.

The second row panel pads PPDH may be closer to the display area DA than the first row panel pads PPDL in the second direction DR2.

The panel pad group areas PPAn may each be divided into first to third panel pad areas PPA1-1, PPA1-2, and PPA1-3. The firth to third panel pad areas PPA1-1, PPA1-2, and PPA1-3 may be sequentially disposed in the second direction DR2. The first to third panel pad areas PPA1-1, PPA1-2, and PPA1-3 may extend in the first direction DR1 and be divided by two virtual lines VL5 and VL6 spaced apart from each other.

Some pads PPD1 of the first row panel pads PPDL may be disposed on the first panel pad area PPA1-1. Other pads PPD2 of the first row panel pads PPDL may be disposed on the second panel pad area PPA1-2. Some pads PPD3 of the second row panel pads PPDH may be disposed on the second panel pad area PPA1-2. Other pads PPD4 of the second row panel pads PPDH may be disposed on the third panel pad area PPA1-3.

The first row panel pads PPDL may be arranged in a stair shape within one panel pad group area PPA1, and the second row panel pads PPDH may be arranged in a stair shape within one panel group area PPA1.

Corresponding first and second row panel pads PPDL and PPDH, may have the same shape within one panel pad group area PPA1. Particularly, one first row panel pad PPDL and one second row panel pad PPDH, which are spaced apart from each other in the second direction DR2 and disposed at the same position in the first direction DR1, may have the same shape.

Corresponding first and second row output pads OPDL and OPDH may be disposed at the same position within one output pad group area OPA1 Each of the second row panel pads PPDH may be disposed a predetermined distance Dt from each of the corresponding first row panel pads PPDL in the second direction DR2.

According to an embodiment of the inventive concept, more pads may be disposed within the limited area of the display panel 110 according to the arrangement of the panel pads PPD. Thus, the mounting area MA of the display panel 110 may be reduced.

Figure 11:
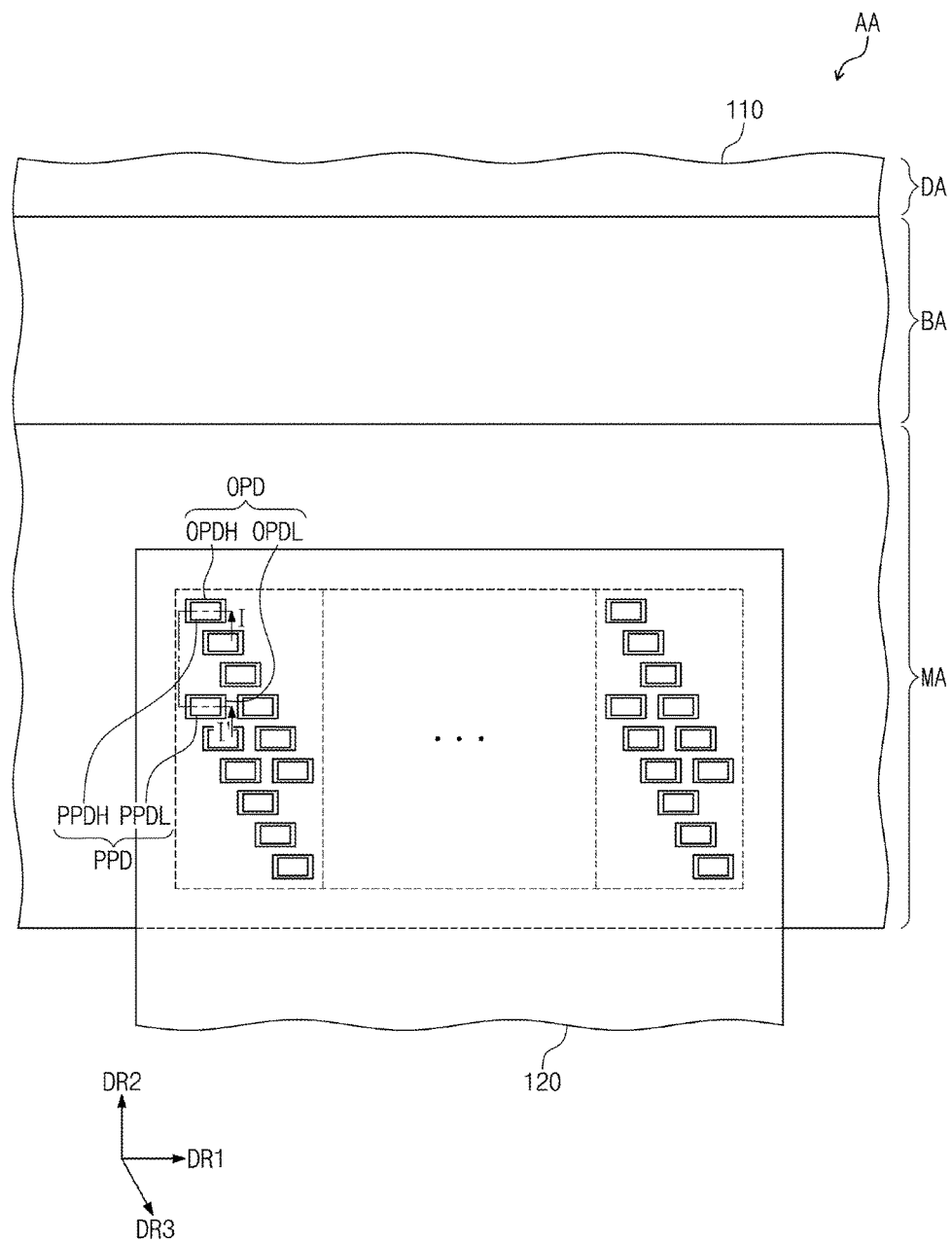
FIG. 11 is an enlarged plan view of the area AA of FIG. 1 in a state in which the display panel and the flexible printed circuit board are coupled to each other.
Figure 12:
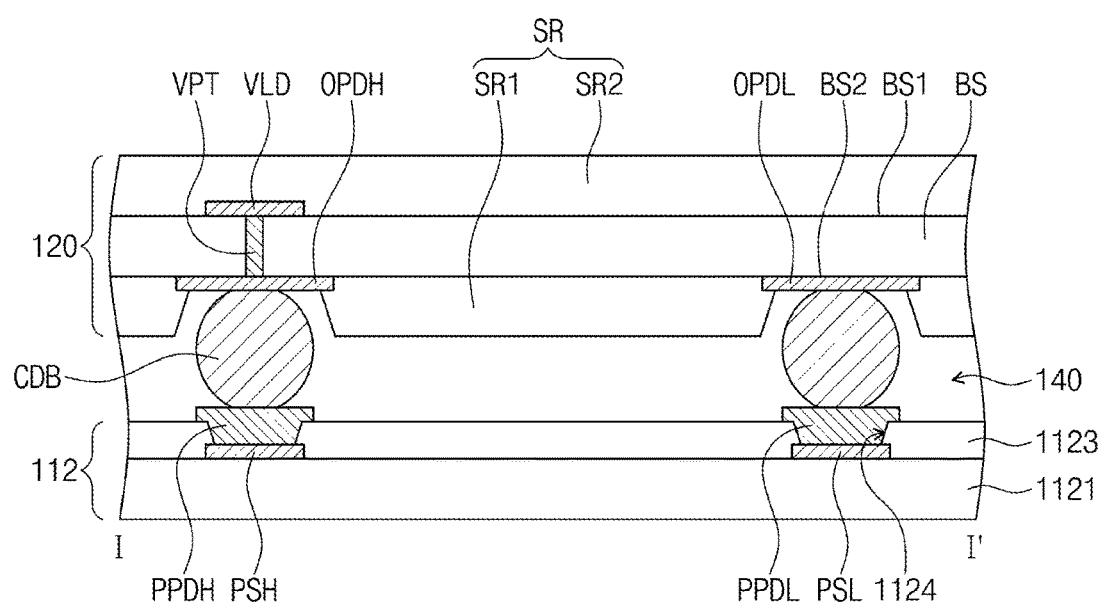
FIG. 12 is a cross-sectional view taken along line I-I' of FIG. 11.
Figure 13:
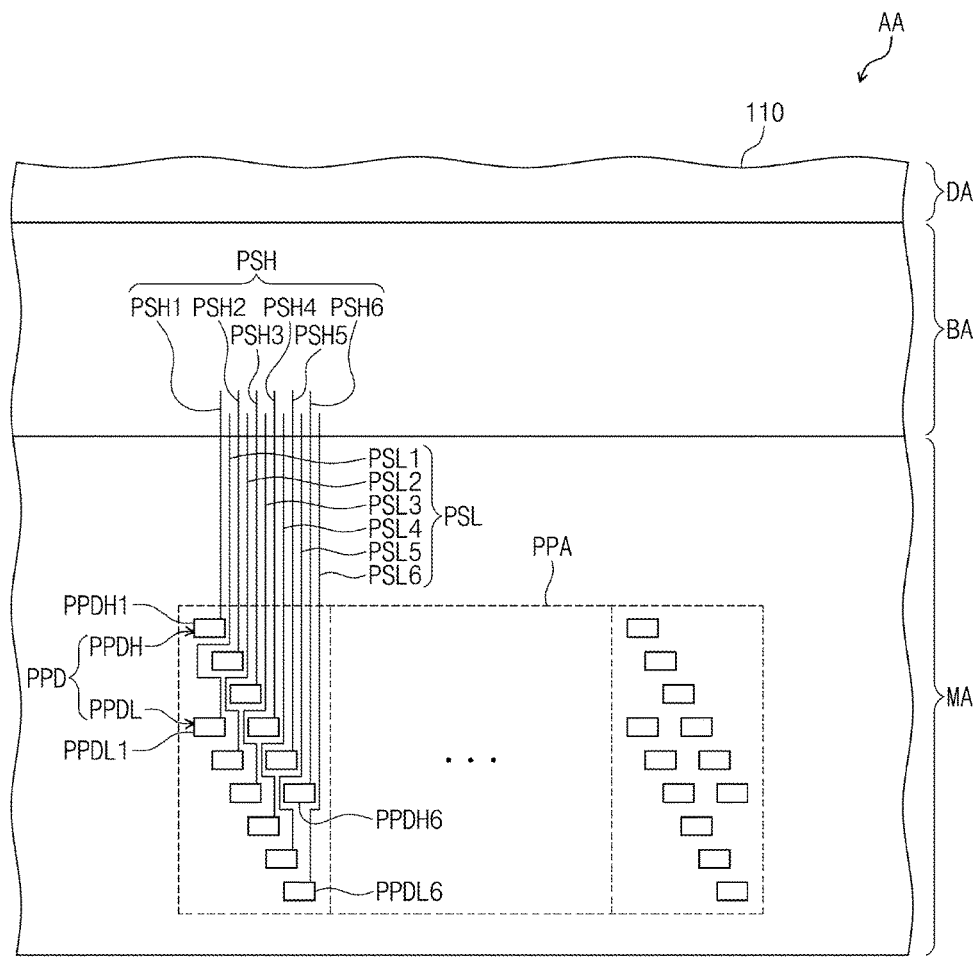
FIG. 13 is a plan view of the panel pads and panel lines, which are disposed on the display panel that corresponds to the area AA of FIG. 1.

FIG. 11 is an enlarged plan view of the area AA of FIG. 1 in the state in which the display panel is coupled to the flexible printed circuit board, FIG. 12 is a cross-sectional view taken along line I-I' of FIG. 11, and FIG. 13 is a plan view of the panel pads and the panel lines disposed on the area AA of FIG. 1.

Referring to FIGS. 11 to 13, each of the output pads OPD may have an area greater than that of each of the panel pads PPD. The output pads OPD may cover respective panel pads PPD. However, an embodiment of the inventive concept is not limited thereto. For example, when the display panel 110 and the flexible printed circuit board 120 are bonded to each other, each of the output pads OPD may partially non-overlap, or be offset from, each of the panel pads PPD due to, e.g., process error.

The display substrate 112 of the display panel 110 may include a substrate 1121 and panel lines PSL and PSH disposed on the substrate 1121. The panel lines PSL and PSH may be gate lines, data lines, or other signal lines. The panel lines PSL and PSH may include first row panel lines PSL connected to the first row panel pads PPDL, and second row panel lines PSH connected to the second row panel pads PPDH. Detailed descriptions will follow below.

The panel lines PSL and PSH may be disposed on an insulation layer 1123. The insulation layer 1123 may include a barrier layer and passivation layers. The panel pads PPD may be disposed on the insulation layer 1123 and connected to the panel lines PSL and PSH through through-holes 1124 defined in the insulation layer 1123. The first row panel pads PPDL may be connected to the first row panel lines PSL, and the second row panel pads PPDH may be connected to the second row panel lines PSH.

The display apparatus 100 may further include a conductive adhesion film 140 disposed between the display panel 110 and the flexible printed circuit board 120. The output pads OPDH and OPDL may be electrically connected to the panel pads PPDH and PPDL through the conductive adhesion film 140. The first row panel pads PPDL may be electrically connected to the first row output pads OPDL through a plurality of conductive balls CDB of the conductive adhesion film 140, respectively. Also, the second row panel pads PPDH may be electrically connected to the second output pads OPDH through the plurality of conductive balls CDB of the conductive adhesion film 140, respectively.

Hereinafter, a shape of each of the panel lines will be described with reference to FIGS. 10 to 13.

Referring to FIGS. 10 and 13, the first row panel lines PSL1 to PSL6 may be connected to the first row panel pads PPDL, respectively. Also, the second panel lines PSH1 to PSH6 may be connected to the second row panel pads PPDH, respectively.

The first row panel lines PSL1 to PSL6 and the second row panel lines PSH1 to PSH6 may be alternately disposed in the first direction DR1.

The second row panel pads PPDH may sequentially include first- to sixth-second row panel pads PPDH1 to PPDH6. The first-second row panel pad PPDH1 may be a pad, of the second row panel pads PPDH, which is closest to the display area DA. The sixth-second row panel pad PPDH6 may be a pad of the second row panel pads PPDH which is farthest away from the display area DA. The second row panel lines PSH1 to PSH6 may be connected to the first- to sixth-second row panel pads PPDH1 to PPDH6, respectively.

The first row panel pads PPDL may sequentially include first- to sixth-first row panel pads PPDL1 to PPDL6. The first-first row panel pad PPDL1 may be a pad, of the first row panel pads PPDL, which is closest to the display area DA. The sixth-first row panel pad PPDL6 may be a pad, of the first row panel pads PPDL, which is farthest away from the display area DA. The first row panel lines PSL1 to PSL6 may be connected to the first- to sixth-first row panel pads PPDL1 to PPDL6, respectively.

The first row panel line PSL1 may pass between the first-second row panel pad PPDH1 and the second-second row panel pad PPDH2. The second-first row panel line PSL2 may pass between the second- and third-second row panel pads PPDH2 and PPDH3. The third-first row panel line PSL3 may pass between the third- and fourth-second row panel pads PPDH3 and PPDH4. The fourth-first row panel line PSL4 may pass between the fourth- and fifth-second row panel pads PPDH4 and PPDH5. The fifth-first row panel line PSL5 may pass between the fifth- and sixth-second row panel pads PPDH5 and PPDH6.

Figure 14:
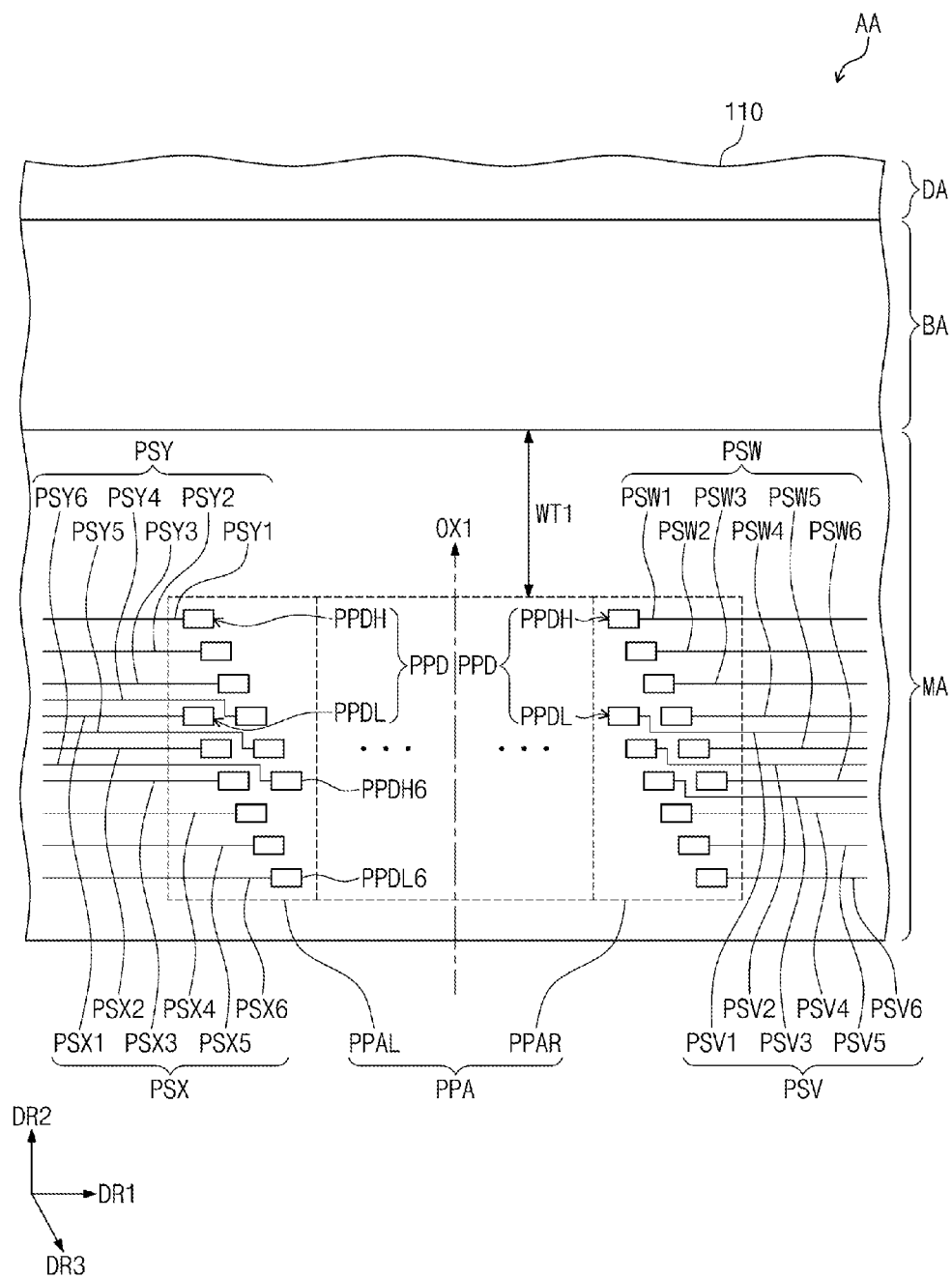
FIG. 14 is a plan view of panel pads and panel lines which correspond to the area AA of FIG. 1, on a display panel according to another embodiment of the inventive concept.

FIG. 14 is a plan view of panel pads and panel wires which correspond to the area AA of FIG. 1, on a display panel according to another embodiment of the inventive concept.

Since panel pads PPD of FIG. 14 are substantially the same as the panel pads PPD described with reference to FIG. 13, the same reference numerals correspond to like structures, and their detailed descriptions will be omitted.

A panel pad area PPA may be divided into a left panel pad area PPAL and a right panel pad area PPAR by a virtual line OX1 that extends in the second direction DR2.

Panel lines may include left panel lines PSX and PSY, and right panel lines PSW and PSV.

The left panel lines PSX and PSY may be connected to the panel pads PPD disposed on the left panel pad area PPAL.

The left panel lines PSX and PSY may include first row left panel lines PSX1 to PSX6 and second row left panel lines PSY1 to PSY6.

The first row left panel lines PSX1 to PSX6 may be connected to first row panel pads PPDL disposed on the left panel pad area PPAL, respectively. The second row left panel lines PSY1 to PSY6 may be connected to second row panel pads PPDH disposed on the left panel pad area PPAL, respectively.

The first row left panel lines PSX1 to PSX6 and the second row left panel lines PSY1 to PSY6 extend to a left outer side of the panel pad area PPA. The first row left panel lines PSX1 to PSX6 and the second row left panel lines PSY1 to PSY6 extend from the outside in a direction opposite to the first direction DR1 of the panel pad area PPA in the direction opposite to the first direction DR1. Portions PSY5 and PSY6 of the second row left panel lines PSY1 to PSY6 may pass between the first row panel pads PPDL disposed on the left panel pad area PPAL.

The right panel lines PSW and PSV may be connected to the panel pads PPD disposed on the right panel pad area PPAR.

The right panel lines PSW and PSV may include first row right panel lines PSV1 to PSV6 and second row right panel lines PSW1 to PSW6.

The first row right panel lines PSV1 to PSV6 may be connected to the first row panel pads PPDL disposed on the right panel pad area PPAR, respectively. The second row right panel lines PSW1 to PSW6 may be connected to the second row panel pads PPDH disposed on the right panel pad area PPAL, respectively.

The first row right panel lines PSV1 to PSV6 and the second row right panel lines PSW1 to PSW6 extend to a right outer side of the panel pad area PPA. The first row right panel lines PSV1 to PSV6 and the second row right panel lines PSW1 to PSW6 extend from the outside in the first direction DR1 of the panel pad area PPA. Portions PSV1 and PSV2 of the first row right panel lines PSV1 to PSV6 may pass between the second row panel pads PPDH disposed on the right panel pad area PPAR.

According to an embodiment of the inventive concept, which is described with reference to FIG. 14, the panel lines PSX, PSY, PSV, and PSW may extend in the first direction DR1 and the direction opposite to the first direction DR1 without extending from the outside of the panel pad area PPA in the second direction DR2. Thus, a distance WT1 between the non-display area BA and the panel pad area PPA may be reduced in the second direction DR2 to reduce the mounting area MA.

Figure 15:
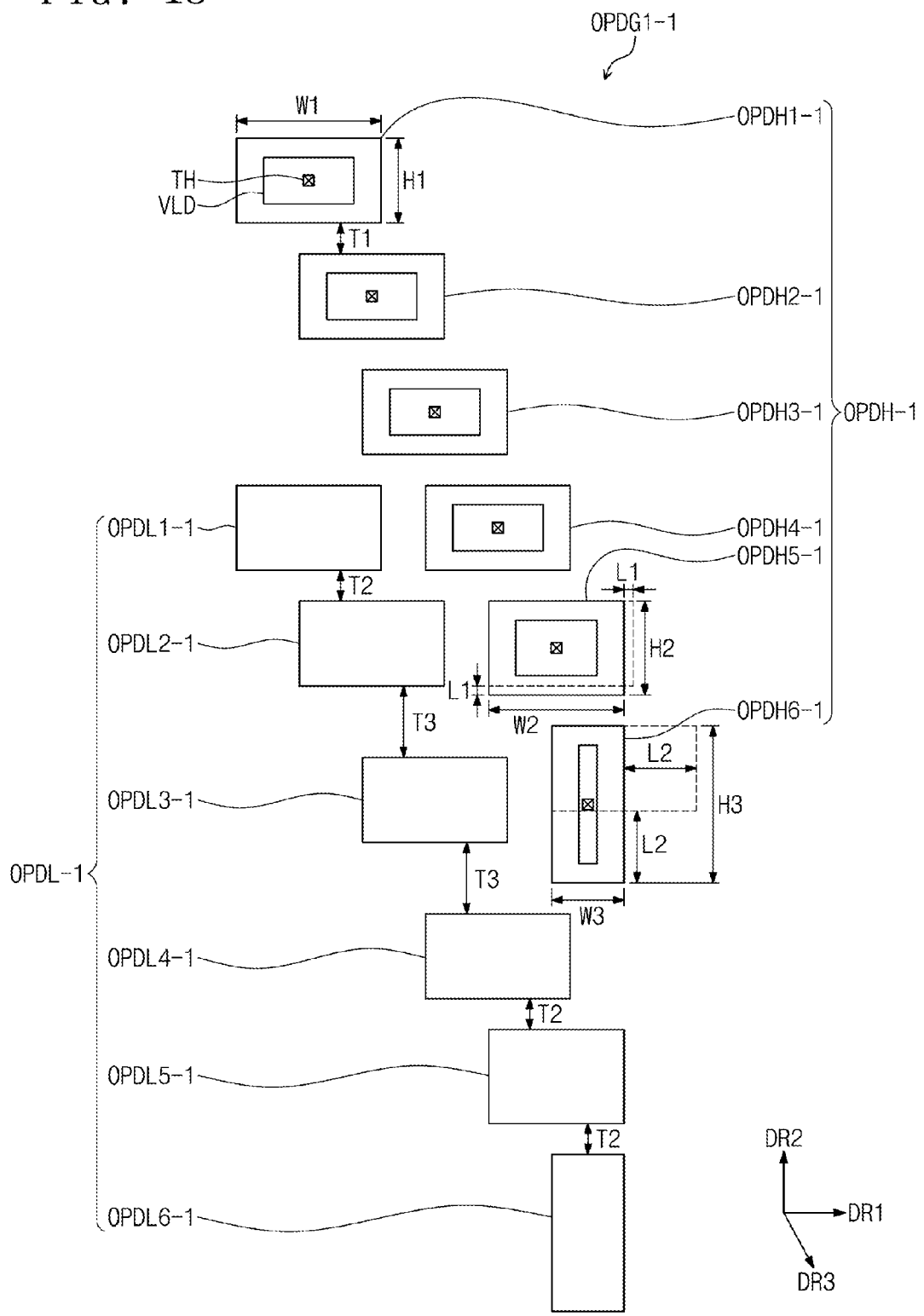
FIG. 15 is a plan view of one output pad group according to another embodiment of the inventive concept.

FIG. 15 is a plan view of one output pad group according to another embodiment of the inventive concept.

When comparing the output pad group OPDG1 of FIG. 3, an output pad group OPDG1-1 of FIG. 15 may include pads having shapes different from each other when viewed in plan view.

The output pad group OPDG1-1 may include first row output pads OPDL-1 and second pad output pads OPDH-1. The first row output pads OPDL-1 may sequentially include first- to sixth-first row output pads OPDL1-1 to OPDL6-1. The second row output pads OPDH-1 may sequentially include first- to sixth-second row output pads OPDH1-1 to OPDH6-1.

One first row output pad OPDL-1 and one corresponding second row output pad OPDH-1, which are spaced apart from each other in the second direction DR2 and disposed at the same position in the first direction DR1, may have the same shape. For example, the first-first row output pad OPDL1-1 and the first-second row output pad OPDH1-1 may have the same shape.

In another embodiment of the inventive concept, the first row output pads OPDL-1 and the second row output pads OPDH-1 may have first to third shapes.

Each of the first- to fourth-first row output pads OPDL1-1 to OPDL4-1 may have the first shape, the fifth-first row output pad OPDL5-1 may have the second shape, and the sixth-first row output pad OPDL6-1 may have the third shape. Similarly, each of the first- to fourth-second row output pads OPDH1-1 to OPDH4-1 may have the first shape, the fifth-second row output pad OPDH5-1 may have the second shape, and the sixth-second row output pad OPDH6-1 may have the third shape.

The first shape has a first width W1 in the first direction DR1 and a first height H1 in the second direction DR2. The second shape has a second width W2 in the first direction DR1 and a second height H2 in the second direction DR2. The second width W2 may be less than the first width W1 by a first length L1. The second height H2 may be greater than the first height H1 by the first length L1.

The third shape has a third width W3 in the first direction DR1 and a third height H3 in the second direction DR2. The third width W3 may be less than the first width W1 by a second length L2. The third height H3 may be greater than the first height H1 by the second length L2.

The second row output pads OPDH-1 may be spaced a first distance T1 from each other in the second direction DR2.

The first row output pads OPDL-1 may be spaced apart from each other by two different distances. For example, the first- and second-first row output pads OPDL1-1 and OPDL2-1 may be spaced a second distance T2 from each other in the second direction DR2, and the second- and third-first row output pads OPDL2-1 and OPDL3-1 may be spaced a third distance T3 from each other in the second direction DR2. The third- and fourth-first row output pads OPDL3-1 and OPDL4-1 may be spaced the third distance T3 from each other in the second direction DR2. The fourth- and fifth-first row output pads OPDL4-1 and OPDL5-1 may be spaced the second distance T2 from each other in the second direction DR2. The fifth- and sixth-first row output pads OPDL5-1 and OPDL6-1 may be spaced the second distance T2 from each other in the second direction DR2. The first distance T1 may be the same as the second distance T2.

When comparing the output pad group OPDG1 of FIG. 3, the output pad group OPDG1-1 of FIG. 15 may have a width that is reduced in the first direction DR1. Thus, in the display apparatus 100 according to another embodiment of the inventive concept, more output pad groups may be disposed on the flexible printed circuit board 120 in the first direction DR1.

Figure 16:
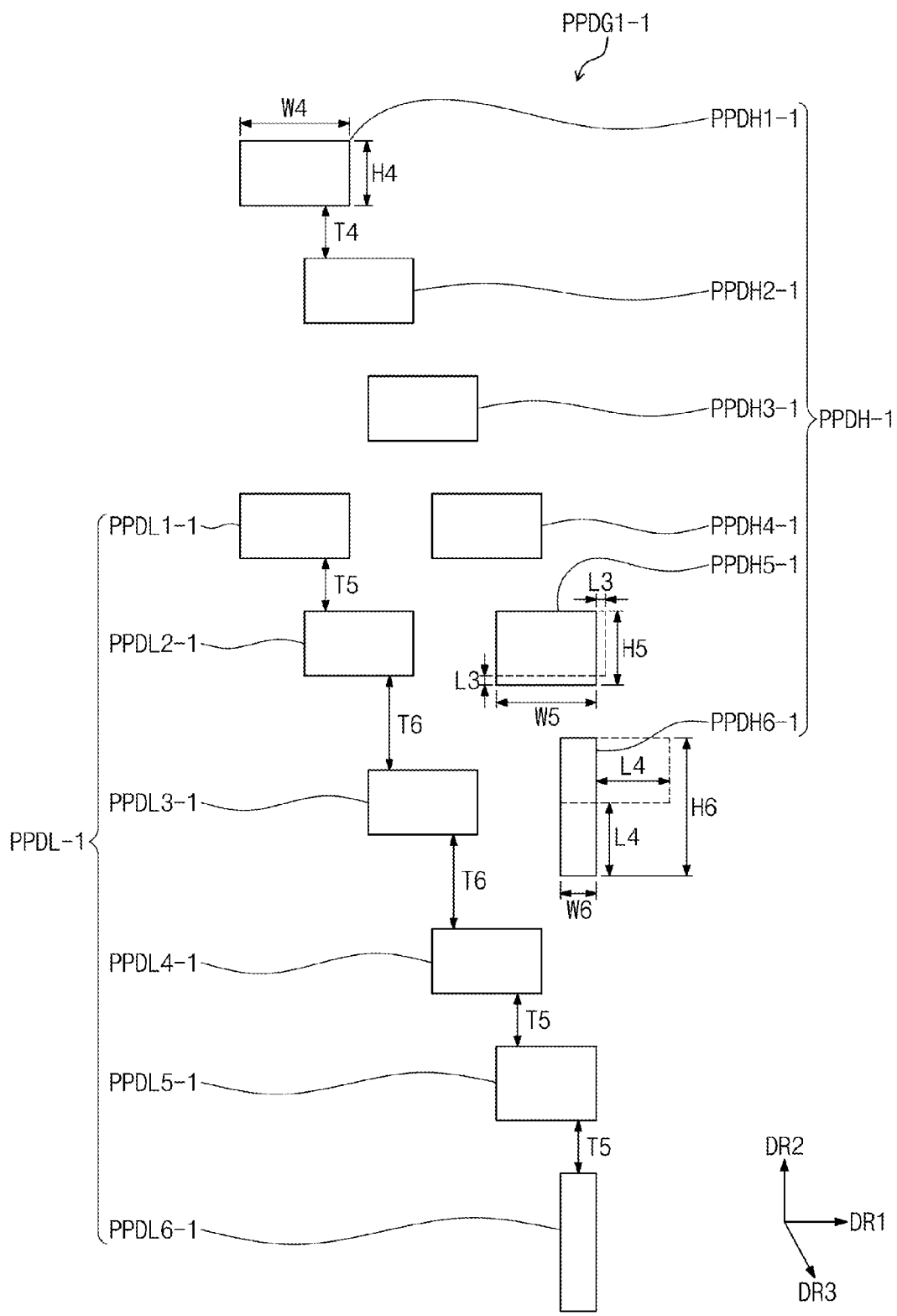
FIG. 16 is a plan view of the panel pads corresponding to the output pad group of FIG. 15.

FIG. 16 is a plan view of the panel pads corresponding to the output pad group of FIG. 15.

When comparing the panel pad group PPDG1 of FIG. 10, a panel pad group PPDG1-1 of FIG. 16 may include pads having shapes different from each other in plan view.

The panel pad group PPDG1-1 may include first row panel pads PPDL-1 and second row panel pads PPDH-1. The first row panel pads PPDL-1 may sequentially include first- to sixth-first row panel pads PPDL1-1 to PPDL6-1. The second row panel pads PPDH-1 may sequentially include first- to sixth-second row panel pads PPDH1-1 to PPDH6-1.

One first row panel pad PPDL-1 and one corresponding second row panel pad PPDH-1, which are spaced apart from each other in the second direction DR2 and disposed at the same position in the first direction DR1, may have the same shape. For example, the first-first row panel pad PPDL1-1 and the first-second row panel pad PPDH1-1 may have the same shape.

In another embodiment of the inventive concept, the first row panel pads PPDL-1 and the second row panel pads PPDH-1 may have fourth to sixth shapes.

Each of the first- to fourth-first row panel pads PPDL1-1 to PPDL4-1 may have the fourth shape, the fifth-first row panel pad PPDL5-1 may have the fifth shape, and the sixth-first row panel pad PPDL6-1 may have the sixth shape. Similarly, each of the first- to fourth-second row panel pads PPDH1-1 to PPDH4-1 may have the fourth shape, the fifth-second row panel pad PPDH5-1 may have the fifth shape, and the sixth-second row panel pad PPDH6-1 may have the sixth shape.

The fourth shape has a fourth width W4 in the first direction DR1 and a fourth height H4 in the second direction DR2. The fifth shape has a fifth width W5 in the first direction DR1 and a fifth height H5 in the second direction DR2. The fifth width W5 may be less than the fourth width W4 by a third length L3. The fifth height H5 may be greater than the fourth height H4 by the third length L3.

The sixth shape has a sixth width W6 in the first direction DR1 and a sixth height H6 in the second direction DR2. The sixth width W6 may be less than the fourth width W4 by a fourth length L4. The sixth height H6 may be greater than the fourth height H4 by the fourth length L4.

The second row panel pads PPDH-1 may be spaced a fourth distance T4 from each other in the second direction DR2.

The first row panel pads PPDL-1 may be spaced apart from each other by two different distances. For example, the first- and second-first row panel pads PPDL1-1 and PPDL2-1 may be spaced a fifth distance T5 from each other in the second direction DR2, and the second- and third-first row panel pads PPDL2-1 and PPDL3-1 may be spaced a sixth distance T6 from each other in the second direction DR2. The third- and fourth-first row panel pads PPDL3-1 and PPDL4-1 may be spaced a sixth distance T6 from each other in the second direction DR2. The fourth- and fifth-first row panel pads PPDL4-1 and PPDL5-1 may be spaced the fifth distance T5 from each other in the second direction DR2. The fifth- and sixth-first row panel pads PPDL5-1 and PPDL6-1 may be spaced the fifth distance T5 from each other in the second direction DR2. The fourth distance T4 may be the same as the fifth distance T5.

When comparing the panel pad group PPDG1 of FIG. 10, the panel pad group PPDG1-1 of FIG. 16 may have a width that is reduced in the first direction DR1. Thus, in the display apparatus 100 according to another embodiment of the inventive concept, more output pad groups may be disposed within the mounting areas MA of the display panel 110 in the first direction DR1.

Figure 17:
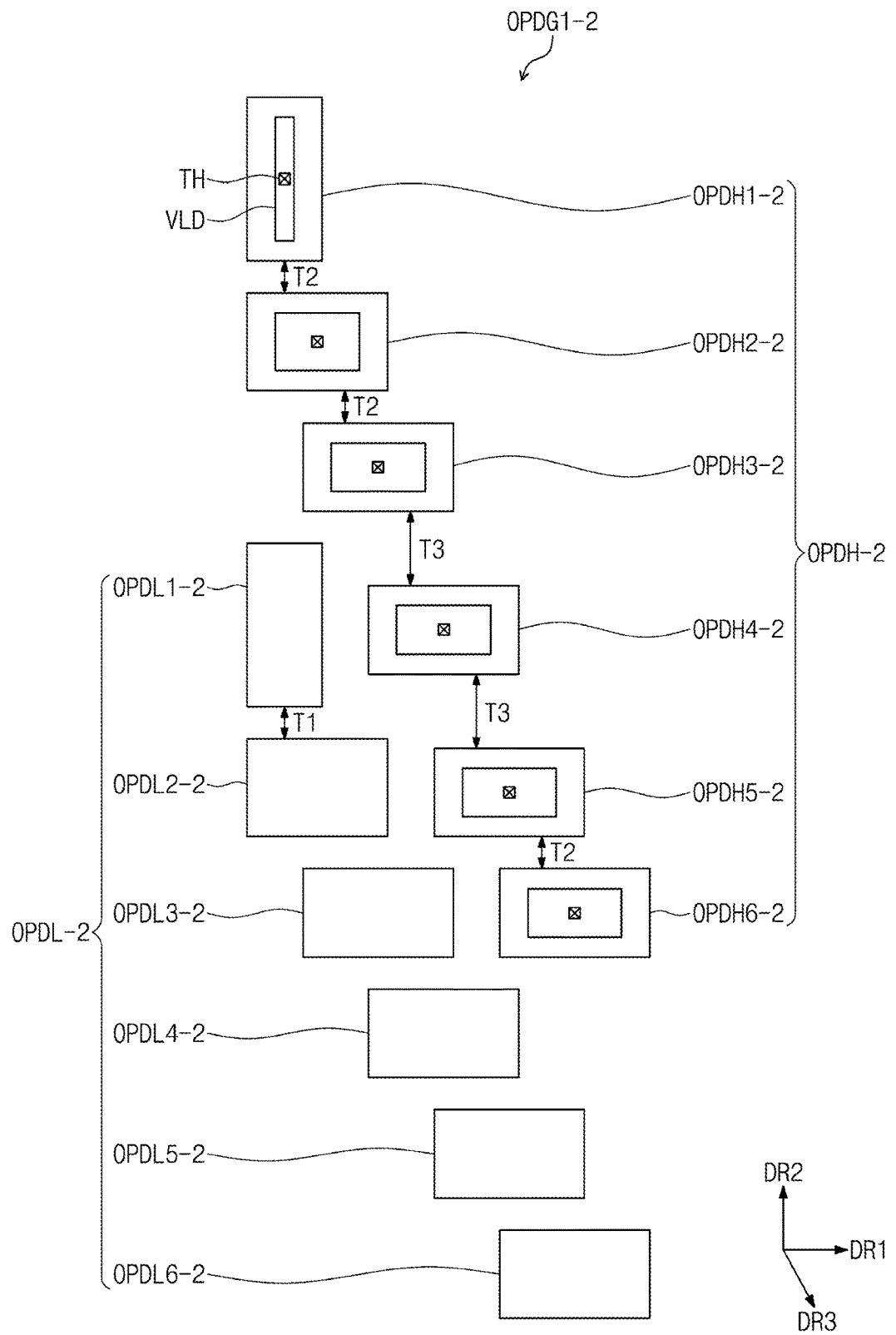
FIG. 17 is a plan view of one output pad group according to further another embodiment of the inventive concept.

FIG. 17 is a plan view of one output pad group according to a further embodiment of the inventive concept.

When comparing the output pad group OPDG1-1 of FIG. 15, an output pad group OPDG1-2 of FIG. 17 may include pads having different shapes.

In FIG. 17, the first-second row output pad OPDH1-2 may have the third shape, the second-second row output pad OPDH2-2 may have the second shape, and the sixth-second row output pad OPDH6-2 may have the first shape.

In FIG. 17, the first row output pads OPDL-2 may be spaced the first distance T1 from each other in the second direction DR2.

The first- and second-second row output pads OPDH1-2 and OPDH2-2 may be spaced the second distance T2 from each other in the second direction DR2. The second- and third-second row output pads OPDH2-2 and OPDH3-2 may be spaced the second distance T2 from each other in the second direction DR2. The third- and fourth-second row output pads OPDH3-2 and OPDH4-2 may be spaced the third distance T3 from each other in the second direction DR2. The fourth- and fifth-second row output pads OPDH4-2 and OPDH5-2 may be spaced the third distance T3 from each other in the second direction DR2. The fifth- and sixth-second row output pads OPDH5-2 and OPDH6-2 may be spaced the second distance T2 from each other in the second direction DR2. The first distance T1 may be the same as the second distance T2.

When comparing the output pad group OPDG1 of FIG. 3, the output pad group OPDG1-2 of FIG. 17 may have a width that is reduced in the first direction DR1. Thus, in the display apparatus 100 according to a further embodiment of the inventive concept, more output pad groups may be disposed on the flexible printed circuit board 120 in the first direction DR1.

Figure 18:
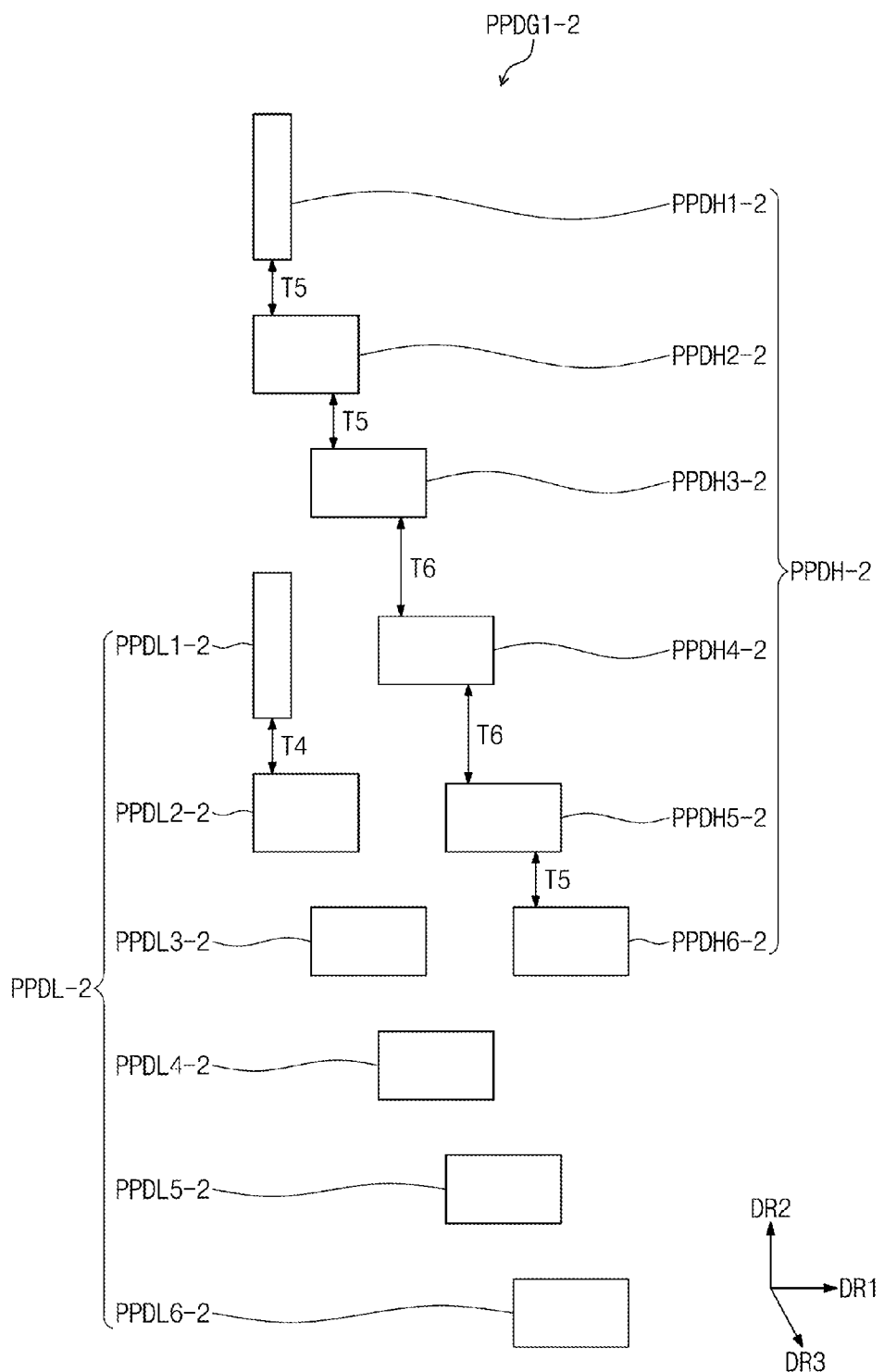
FIG. 18 is a plan view of the pad panels corresponding to the output pad group of FIG. 17.

FIG. 18 is a plan view of the pad panels corresponding to the output pad group of FIG. 17.

When comparing the panel pad group PPDG1-1 of FIG. 16, a panel pad group PPDG1-2 of FIG. 18 may include pads having different shapes.

In FIG. 18, the first-first row panel pad PPDL1-2 may have the third shape, the second-first row panel pad PPDL2-2 may have the second shape, and the sixth-first row panel pad PPDL6-2 may have the first shape.

In FIG. 18, the first row panel pads PPDL-2 may be spaced the fourth distance T4 from each other in the second direction DR2.

The first- and second-second row panel pads PPDH1-2 and PPDH2-2 may be spaced the fifth distance T5 from each other in the second direction DR2. The second- and third-second row panel pads PPDH2-2 and PPDH3-2 may be spaced the fifth distance T5 from each other in the second direction DR2. The third- and fourth-second row panel pads PPDH3-2 and PPDH4-2 may be spaced the sixth distance T6 from each other in the second direction DR2. The fourth- and fifth-second row panel pads PPDH4-2 and PPDH5-2 may be spaced the sixth distance T6 from each other in the second direction DR2. The fifth- and sixth-second row panel pads PPDH5-2 and PPDH6-2 may be spaced the fifth distance T5 from each other in the second direction DR2. The fourth distance T4 may be the same as the fifth distance T5.

When comparing the output pad group PPDG1-1 of FIG. 16, the panel pad group PPDG1-2 of FIG. 18 may have a width that is reduced in the first direction DR1. Thus, in the display apparatus 100 according to another embodiment of the inventive concept, more output pad groups may be disposed within the mounting areas MA of the display panel 110 in the first direction DR1.

Figure 19:
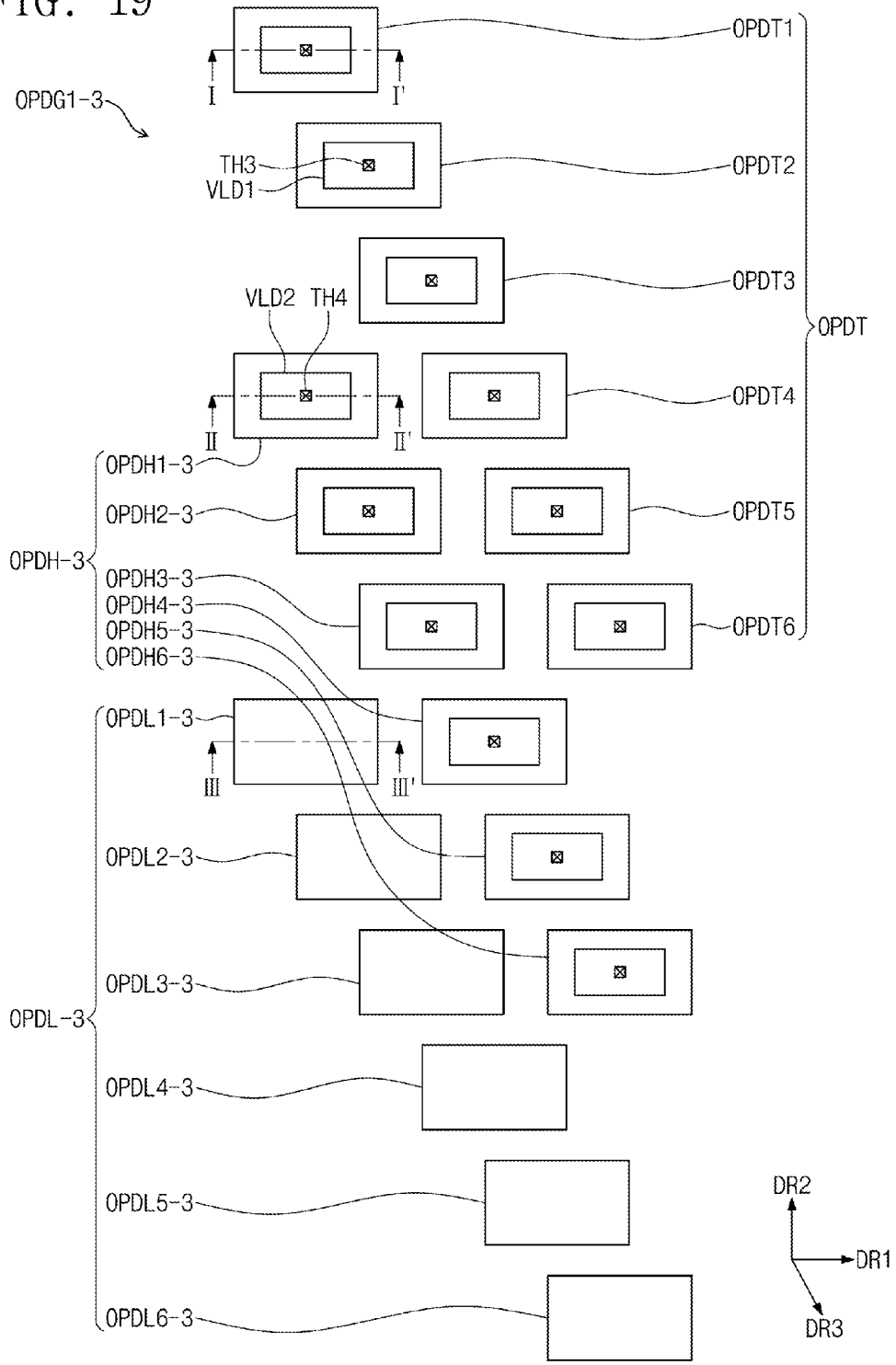
FIG. 19 is a plan view of one output pad group according to another embodiment of the inventive concept.

FIG. 19 is a plan view of one output pad group according to another embodiment of the inventive concept.

When comparing the output pad group OPDG1 of FIG. 3, an output pad group OPDG1-3 of FIG. 19 may include first to third row output pads OPDL-3, OPDH-3, and OPDT. Hereinafter, the first and third row output pads OPDL-3, OPDH-3, and OPDT will be exemplified with reference to FIG. 19. However, the embodiment of the inventive concept is not limited thereto. For example, the output pad group according to another embodiment of the inventive concept may include output pads that are arranged in three or more rows.

The first row output pads OPDL-3 may be arranged in the third direction DR3. The first row output pads OPDL-3 may include first- to sixth-first row output pads OPDL1-3 to OPDL6-3.

The second row output pads OPDH-3 may be arranged in the third direction DR3. The second row output pads OPDH-3 may include first- to sixth-second row output pads OPDH1-3 to OPDH6-3. The second row output pads OPDH-3 may be spaced apart from the first row output pads OPDL-3.

The third row output pads OPDT may be arranged in the third direction DR3. The third row output pads OPDT may include first- to sixth-third row output pads OPDT1 to OPDT6. The third row output pads OPDT may be spaced apart from the first and second row output pads OPDL-3 and OPDH-3.

Each of the second row output pads OPDH-3 may be spaced apart from a corresponding one of the first row output pads OPDL-3 by a predetermined distance in the second direction DR2. Each of the third row output pads OPDT may be spaced apart from a corresponding one of the first row output pads OPDL-3 by a predetermined distance in the second direction DR2.

Figure 20:
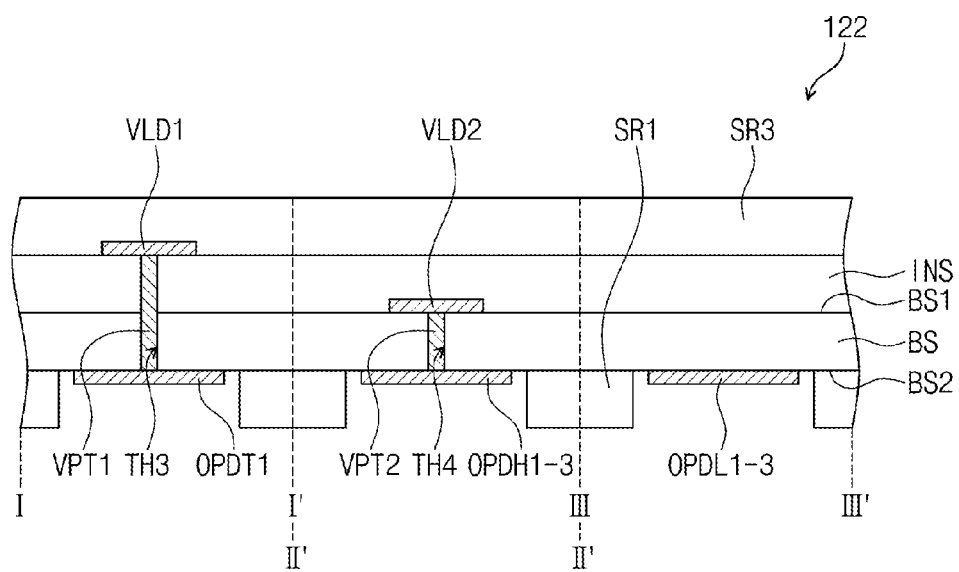
FIG. 20 is a cross-sectional view taken along each of line I-I', II-II', and III-III' of FIG. 19.

FIG. 20 is a cross-sectional view taken along each of line I-I', II-II', and III-III' of FIG. 19.

Referring to FIGS. 19 and 20, the flexible line board 122 may include a base substrate BS, an insulation layer INS, first via lands VLD1, second via lands VLD2, first via patterns VPT1, second via patterns VPT2, and solder resistors SR1 and SR3.

The first row output pads OPDL-3, the second row output pads OPDH-3, and the third row output pads OPDT may be disposed on the other surface BS2 of the base substrate BS. The first row output pads OPDL-3, the second row output pads OPDH-3, and the third row output pads OPDT may be disposed on the same layer.

The insulation layer INS may be disposed on one surface BS1 of the base substrate BS.

The first via lands VLD1 may be disposed on the insulation layer INS. The first via lands VLD1 may overlap respective third row output pads OPDT. Each of the third row output pads OPDT may have an area greater than that of each of the corresponding first via lands VLD1.

First through holes TH may be defined in the base substrate BS and the insulation layer INS, respectively. Each of the first through holes TH3 may overlap one third row output pad OPDT and one corresponding first via land VLD1.

The first via patterns VPT1 may be disposed in the first through holes TH3. Each of the first via patterns VPT1 may pass through the base substrate BS to contact one of the third row output pads OPDT and an overlapping one of the first via lands VLD1. Each of the first via patterns VPT1 may be formed of a conductive material to electrically connect one of the third row output pads OPDT to its overlapping first via land VLD1.

The second via lands VLD2 may be disposed on the one surface BS1 of the base substrate BS. The second via lands VLD2 may overlap respective second row output pads OPDH-3. Each of the second row output pads OPDH-3 may have an area greater than that of each of the corresponding second via lands VLD2.

Second through holes TH4 may be defined in the base substrate BS. Each of the second through holes TH4 may overlap one second row output pad OPDH-3 and one corresponding second via land VLD2.

The second via patterns VPT2 may be disposed in the second through holes TH4. Each of the second via patterns VPT2 may pass through the base substrate BS to contact one of the second row output pads OPDH-3 and an overlapping one of the second via lands VLD2. Each of the second via patterns VPT2 may be formed of a conductive material to electrically connect one of the second row output pads OPDH-3 to its overlapping second via land VLD2.

The solder resistor SR may include a first solder resistor SR1 and a third solder resistor SR3.

The first solder resistor SR1 may be disposed on the other surface BS2 of the base substrate BS. The first solder resistor SR1 may cover lines (not shown) disposed on the other surface BS2 of the base substrate BS. An opening for exposing each of the first to third row output pads OPDL-3, OPDH-3, and OPDT may be defined in the first solder resistor SR1.

The third solder resistor SR3 may be disposed on the one surface BS1 of the base substrate BS. The third solder resistor SR3 may cover lines (not shown) disposed on the one surface BS1 of the base substrate BS.

Figure 21:
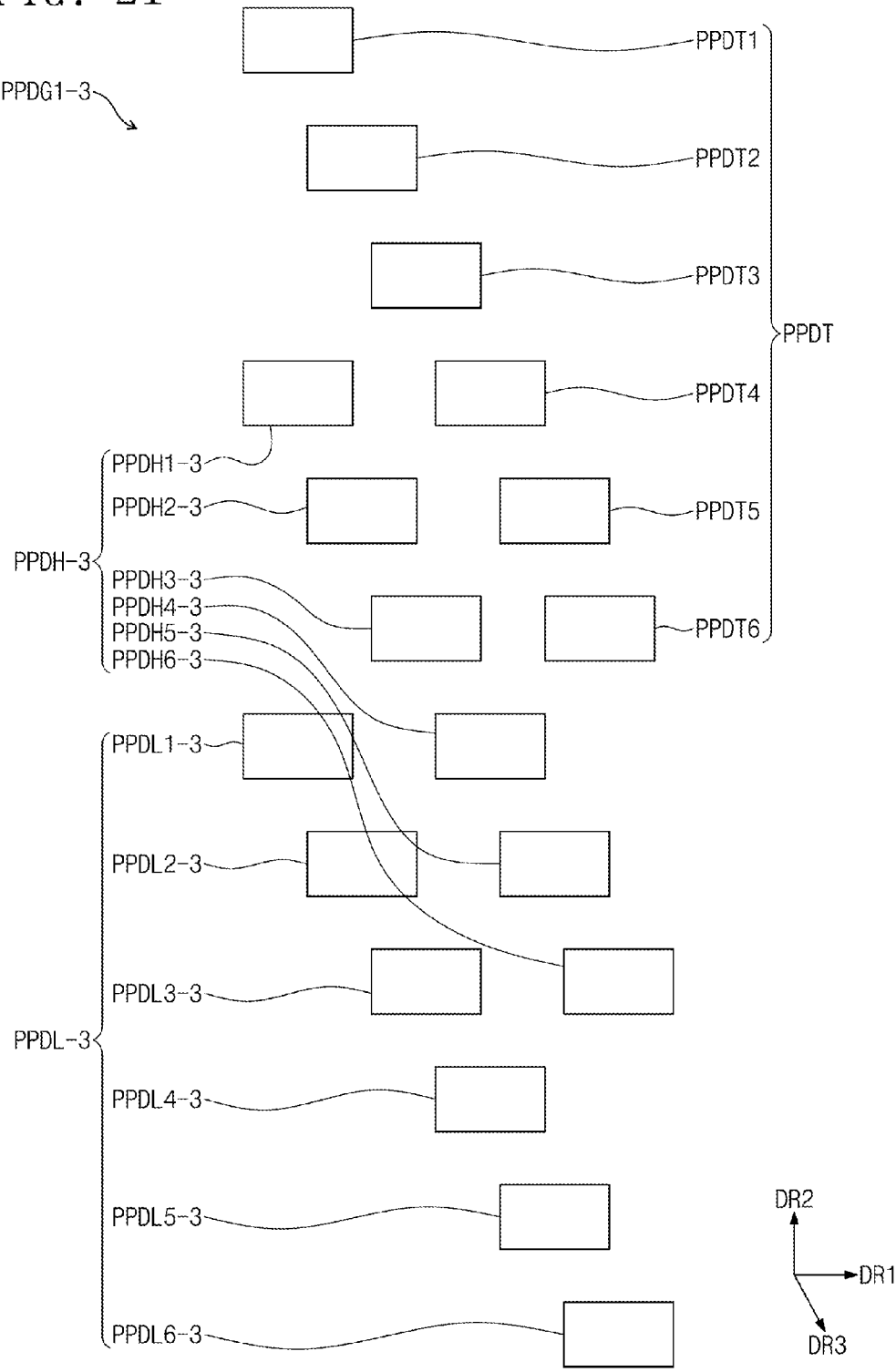
FIG. 21 is a plan view of the pad panels corresponding to the output pad group of FIG. 19.

FIG. 21 is a plan view of the pad panels corresponding to the output pad group of FIG. 19.

When comparing the panel pad group PPDG1 of FIG. 10, a panel pad group PPDG1-3 of FIG. 21 may include first to third row panel pads PPDL-3, PPDH-3, and PPDT. Hereinafter, the first and third row panel pads PPDL-3, PPDH-3, and PPDT will be exemplified with reference with FIG. 21. However, the embodiment of the inventive concept is not limited thereto. For example, the panel pad group according to another embodiment of the inventive concept may include panel pads that are arranged in three or more rows.

The first row panel pads PPDL-3 may be arranged in the third direction DR3. The first row panel pads PPDL-3 may include first- to sixth-first row panel pads PPDL1-3 to PPDL6-3.

The second row panel pads PPDH-3 may be arranged in the third direction DR3. The second row panel pads PPDH-3 may include first- to sixth-second row panel pads PPDH1-3 to PPDH6-3. The second row panel pads PPDH-3 may be spaced apart from the first row panel pads PPDL-3.

The third row panel pads PPDT may be arranged in the third direction DR3. The third row panel pads PPDT may include first- to sixth-third row panel pads PPDT1 to PPDT6. The third row panel pads PPDT may be spaced apart from the first and second row panel pads PPDL-3 and PPDH-3.

Each of the second row panel pads PPDH-3 may be disposed a predetermined distance from its corresponding first row panel pad PPDL-3 in the second direction DR2. Each of the third row panel pads PPDT may be disposed at a predetermined distance from the corresponding first row panel pad PPDL-3 in the second direction DR2.

Figure 22:
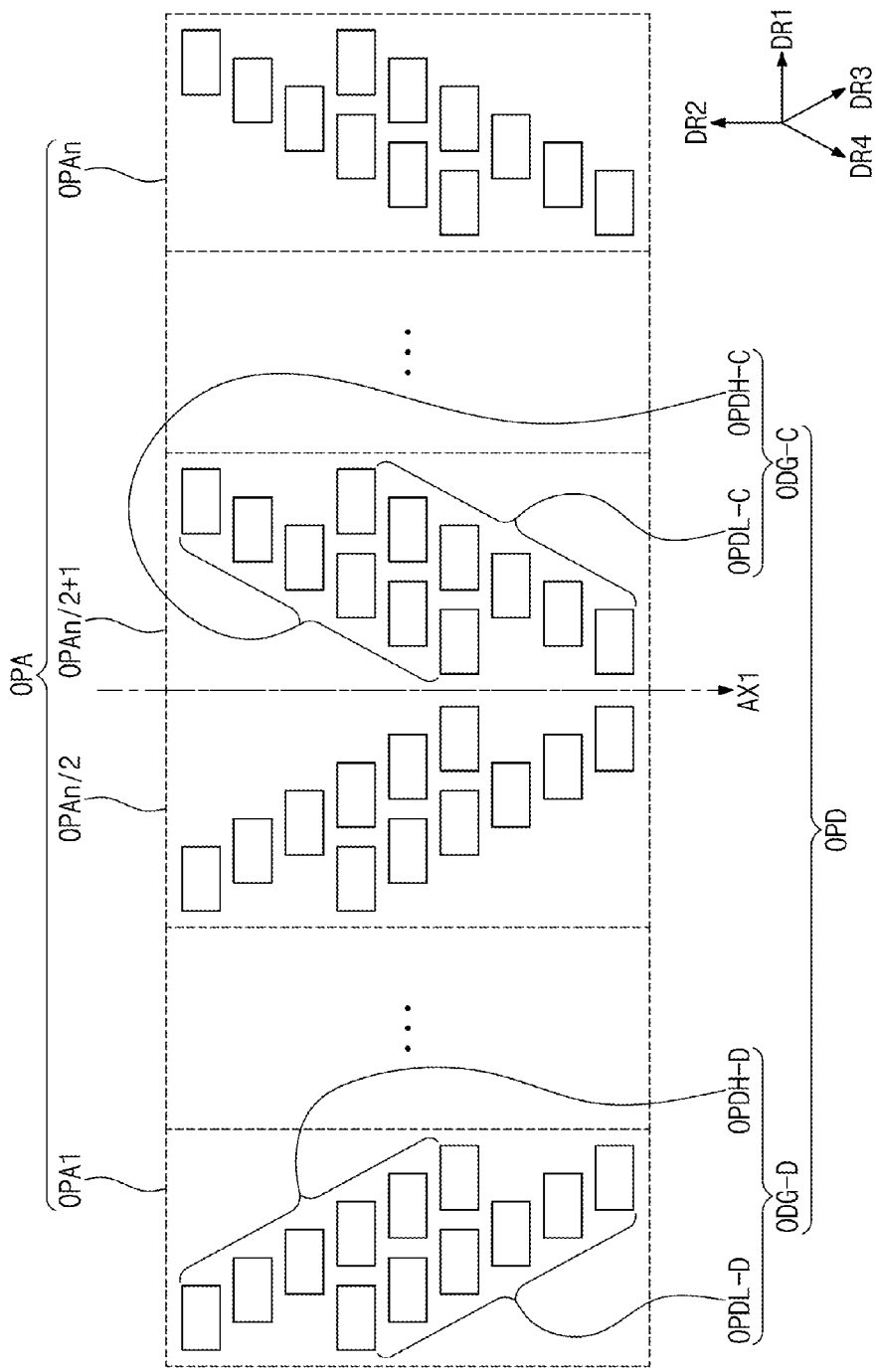
FIG. 22 is a plan view of output pads according to another embodiment of the inventive concept.

FIG. 22 is a plan view of output pads according to another embodiment of the inventive concept.

Referring to FIG. 22, the output pad area OPA may be divided into first to n-th output pad group areas OPA1 to OPAn. The first to n-th output pad group areas OPA1 to OPAn may be adjacent to each other in the first direction DR1. The first to n-th output pad group areas OPA1 to OPAn may be divided by virtual lines extending in the second direction DR2.

The output pads OPD may include diagonal output pad groups ODG-D and crossing output pad groups ODG-C. Each of the diagonal output pad groups ODG-D and each of the crossing output pad groups ODG-C may be disposed within one of the first to n-th output pad group areas OPA1 to OPAn.

The diagonal output pad groups ODG-D may each have the same pad arrangement. The crossing output pad groups ODG-C may each have the same pad arrangement. Each of the diagonal output pad groups ODG-D may have a pad arrangement that differs from that of the crossing output pad groups ODG-C.

In another embodiment of the inventive concept, the diagonal output pad groups ODG-D and the crossing output pad groups ODG-C may be symmetrically disposed about a virtual line AX1 that extends in the second direction D2. The virtual line AX1 may bisect the output pad area OPA.

Each of the diagonal output pad groups ODG-D may be disposed within each of the first to n/2-th output pad group areas OPA1 to OPAn/2 of the first to n-th output pad group areas OPA1 to OPAn. Each of the diagonal output pad groups ODG-D may be disposed within each of the (n/2+1)-th to n-th output pad group areas OPAn/2+1 to OPAn of the first to n-th output pad group areas OPA1 to OPAn.

Hereinafter, a pad arrangement structure of one diagonal output pad group ODG-D will be described.

The diagonal output pad groups ODG-D may include first row diagonal output pads OPDL-D and second row diagonal output pads OPDH-D. The first row diagonal output pads OPDL-D and the second row diagonal output pads OPDH-D may be arranged in the third direction DR3. Since the first row diagonal output pads OPDL-D and the second row crossing output pads OPDL-C are substantially the same as the first row output pads OPDL and the second row output pads OPDH which are described with reference to FIG. 3, their detailed descriptions will be omitted.

Hereinafter, a pad arrangement structure of one crossing output pad group ODG-C will be described.

The crossing output pad groups ODG-C may include first row crossing output pads OPDL-C and second row crossing output pads OPDH-C. The first row crossing output pads OPDL-C and the second row crossing output pads OPDH-C may be arranged in a fourth direction DR4. The fourth direction DR4 may be symmetric to the third direction DR3 with respect to the second direction DR2.

The first row crossing output pads OPDL-C and the first row diagonal output pads OPDL-D may be symmetric to each other with respect to a virtual line that extends in the second direction DR2. The second row crossing output pads OPDH-C and the second row diagonal output pads OPDH-D may be symmetric to each other with respect to a virtual line that extends in the second direction DR2.

The flexible line board 122 may be bonded to the display panel 110 using a conductive adhesion material. In an embodiment of the inventive concept, the diagonal output pad group ODG-D and the crossing output pad group ODG-C may include output pads that are arranged in directions different from each other. The display apparatus according to an embodiment of the inventive concept may include a diagonal output pad group ODG-D and crossing output pad group ODG-C that are symmetric, so as to prevent the flexible line board 122 and the display panel 110 from being twisted when being bonded.

Figure 23:
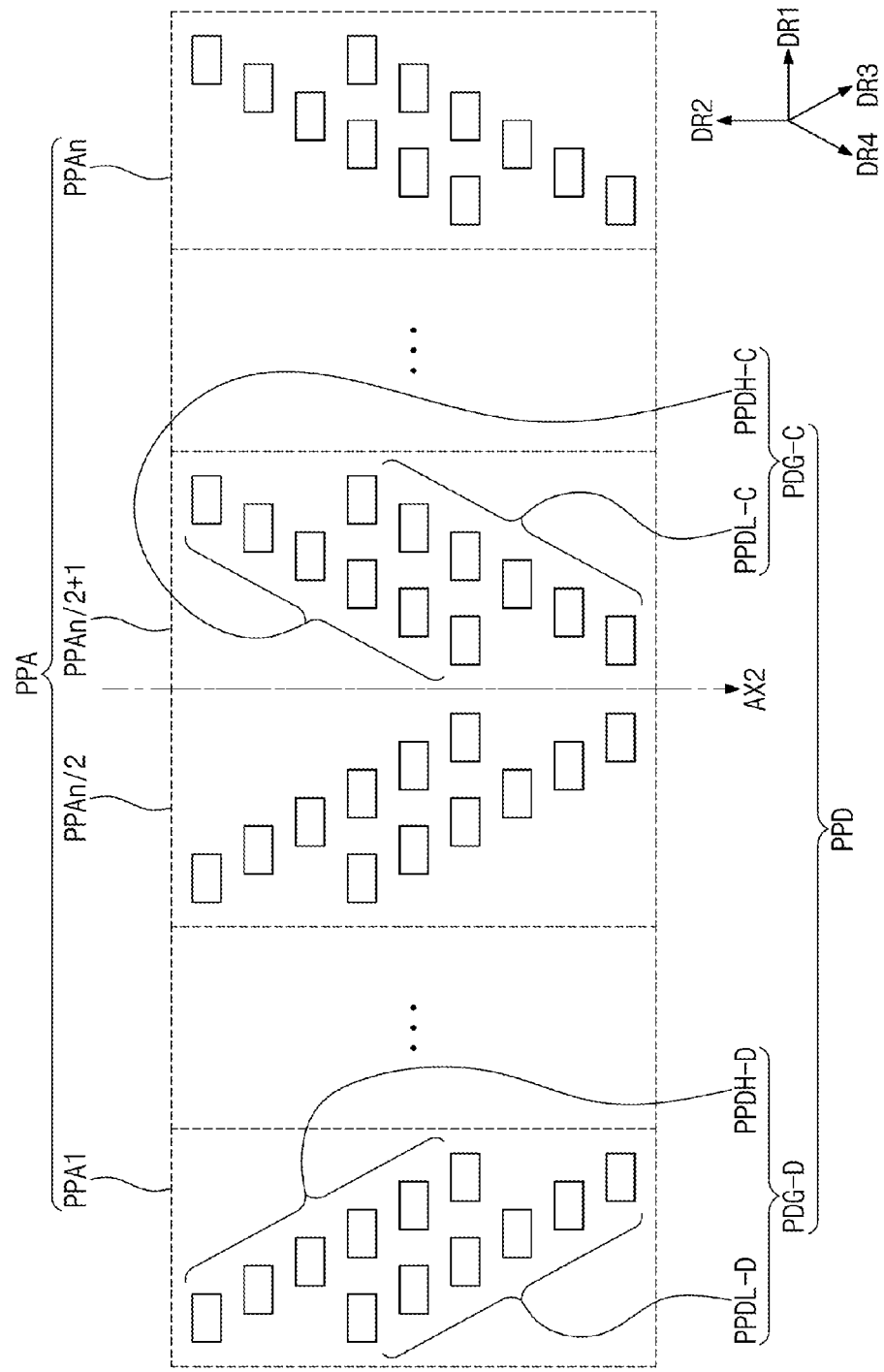
FIG. 23 is a plan view of the panel pads corresponding to the output pads of FIG. 22.

FIG. 23 is a plan view of the panel pads corresponding to the output pads of FIG. 22.

Each of the panel pads PPD may have a shape corresponding to each of the output pads OPD of FIG. 22.

The panel pad area PPA may be divided into first to n-th panel pad group areas PPA1 to PPAn. The first to n-th panel pad group areas PPA1 to PPAn may be adjacent to each other in the first direction DR1. The first to n-th panel pad group areas PPA1 to PPAn may be divided by virtual lines extending in the second direction DR2.

The panel pads PPD may include diagonal panel pad groups PDG-D and crossing panel pad groups PDG-C. Each of the diagonal panel pad groups PDG-D and each of the crossing panel pad groups PDG-C may be disposed within one of the first to n-th panel pad group areas PPA1 to PPAn.

The diagonal panel pad groups PDG-D may each have the same pad arrangement. The crossing panel pad groups PDG-C may each have the same pad arrangement. The pad arrangement of the diagonal panel pad groups PDG-D may differ from the pad arrangement of the crossing panel pad groups PDG-C.

In another embodiment of the inventive concept, the diagonal panel pad groups PDG-D and the crossing panel pad groups PDG-C may be symmetrically disposed about a virtual line AX2 that extends in the second direction D2. The virtual line AX2 may bisect the panel pad area PPA.

Each of the diagonal panel pad groups PDG-D may be disposed within each of first to n/2-th panel pad group areas PPA1 to PPAn/2 of the first to n-th panel pad group areas PPA1 to PPAn. Each of the crossing panel pad groups PDG-C may be disposed within each of (n/2+1)-th to n-th panel pad group areas PPAn/2+1 to PPAn of the first to n-th panel pad group areas PPA1 to PPAn.

Hereinafter, a pad arrangement of one diagonal panel pad group PDG-D will be described.

The diagonal panel pad groups PDG-D may include first row diagonal panel pads PPDL-D and second row diagonal panel pads PPDH-D. The first row diagonal panel pads PPDL-D and the second row diagonal panel pads PPDH-D may be arranged in the third direction DR3. Since the first row diagonal panel pads PPDL-D and the second row crossing panel pads PPDL-C are substantially the same as the first row panel pads PPDL and the second row panel pads PPDH which are described with reference to FIG. 10, their detailed descriptions will be omitted.

Hereinafter, a pad arrangement structure of one crossing panel pad group PDG-C will be described.

The crossing panel pad group PDG-C may include first row crossing panel pads PPDL-C and second row crossing panel pads PPDH-C. The first row crossing panel pads PPDL-C and the second row crossing panel pads PPDH-C may be arranged in the fourth direction DR4.

The first row crossing panel pads PPDL-C and the first row diagonal panel pads PPDL-D may be symmetric with respect to a virtual line that extends in the second direction DR2. The second row crossing panel pads PPDH-C and the second row diagonal panel pads PPDH-D may be symmetric with respect to a virtual line that extends in the second direction DR2.

Figure 24:
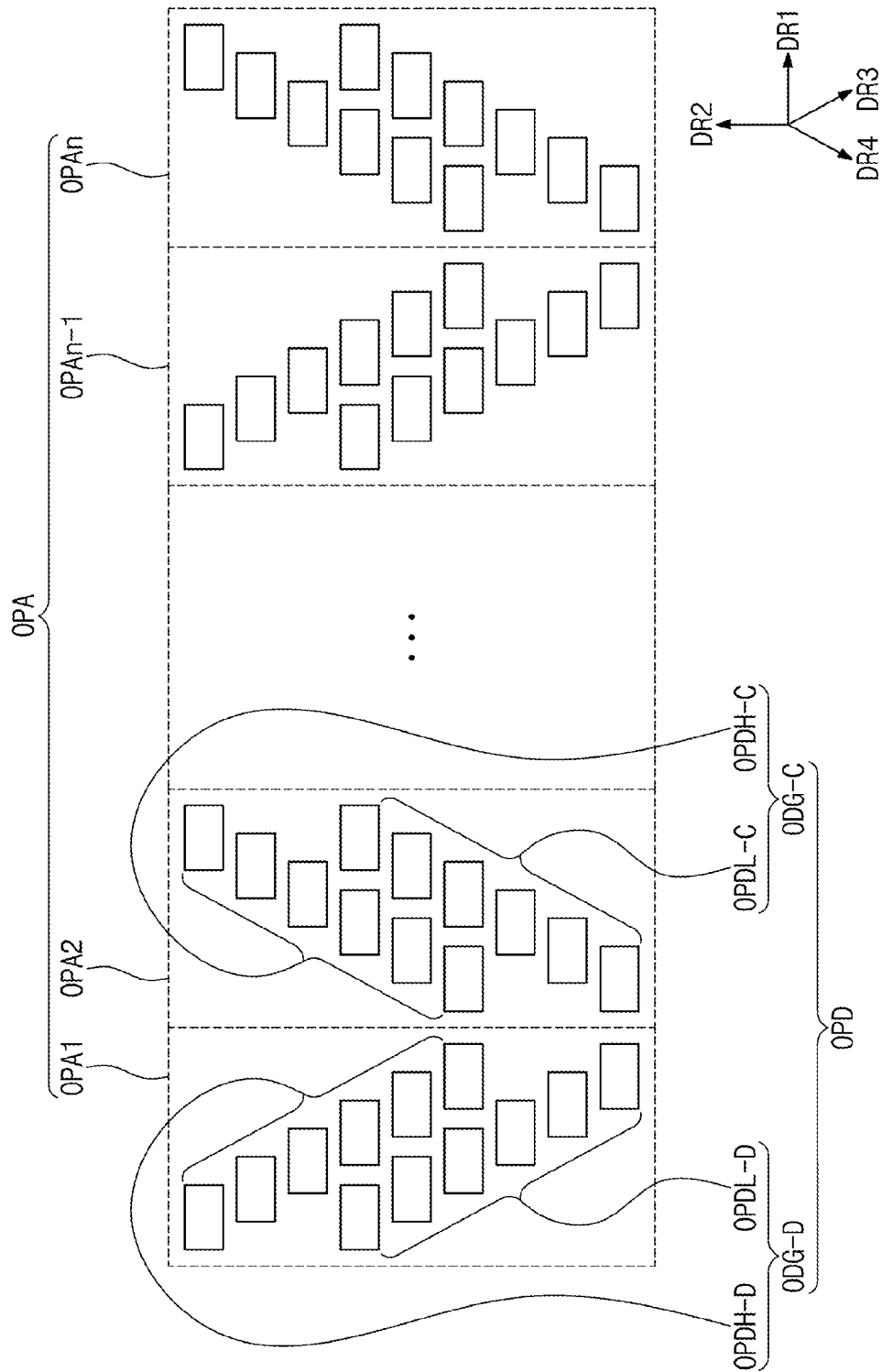
FIG. 24 is a plan view of output pads according to a further embodiment of the inventive concept.

FIG. 24 is a plan view of output pads according to another embodiment of the inventive concept.

The panel pad area OPA may be divided into first to n-th output pad group areas OPA1 to OPAn. The first to n-th output pad group areas OPA1 to OPAn may be adjacent to each other in the first direction DR1. The first to n-th output pad group areas OPA1 to OPAn may be divided by virtual lines extending in the second direction DR2.

The output pads OPD may include diagonal output pad groups ODG-D and crossing output pad groups ODG-C. Since each of the diagonal output pad groups ODG-D and each of the crossing output pad groups ODG-C of FIG. 24 were described with reference to FIG. 22, their detailed descriptions will be omitted.

In another embodiment of the inventive concept, the diagonal output pad groups ODG-D and the crossing output pad groups ODG-C may be alternately disposed in the first direction DR1. More specifically, ones of the diagonal output pad groups ODG-D and ones of the crossing output pad groups ODG-C may be disposed in alternating manner. For example, a diagonal output pad group ODG-D may be disposed on the first output pad group area OPA1, and a crossing output pad group ODG-C may be disposed on the second output pad group area OPA2. This pattern may be continued, so that a diagonal output pad group ODG-D may be disposed on the (n-1)-th output pad group area OPAn-1, and a crossing output pad group ODG-C may be disposed on the n-th output pad group area OPAn.

Figure 25:
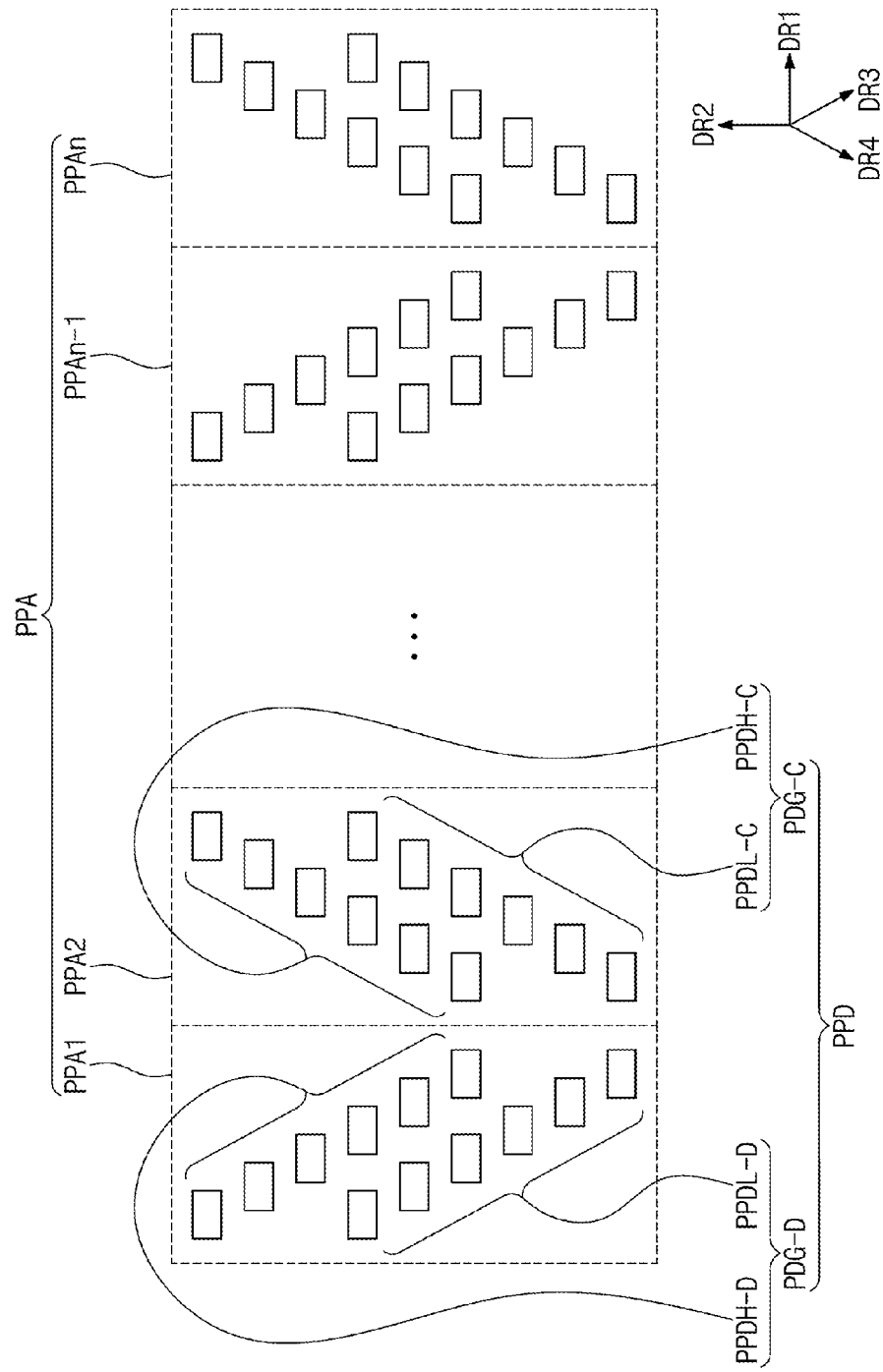
FIG. 25 is a plan view of the panel pads corresponding to the output pads of FIG. 24.

FIG. 25 is a plan view of the panel pads corresponding to the output pads of FIG. 24.

Each of the panel pads PPD may have a shape corresponding to each of the output pads OPD of FIG. 24.

The panel pad area PPA may be divided into first to n-th panel pad group areas PPA1 to PPAn. The first to n-th panel pad group areas PPA1 to PPAn may be adjacent to each other in the first direction DR1. The first to n-th panel pad group areas PPA1 to PPAn may be divided by virtual lines extending in the second direction DR2.

The panel pads PPD may include diagonal panel pad groups PDG-D and crossing panel pad groups PDG-C. Since each of the diagonal panel pad groups PDG-D and each of the crossing panel pad groups PDG-C of FIG. 25 were described with reference to FIG. 23, their detailed descriptions will be omitted.

In another embodiment of the inventive concept, the diagonal panel pad groups PDG-D and the crossing panel pad groups PDG-C may be alternately disposed in the first direction DR1. In particular, ones of the diagonal panel pad groups PDG-D and ones of the crossing panel pad groups PDG-C may be disposed in alternating manner. For example, a diagonal panel pad group PDG-D may be disposed on the first panel pad group area PPA1, and a crossing panel pad group PDG-C may be disposed on the second panel pad group area PPA2. Continuing this pattern, a diagonal panel pad group PDG-D may be disposed on the (n-1)-th panel pad group area PPAn-1, and a crossing panel pad group PDG-C may be disposed on the n-th panel pad group area PPAn.

Figure 26:
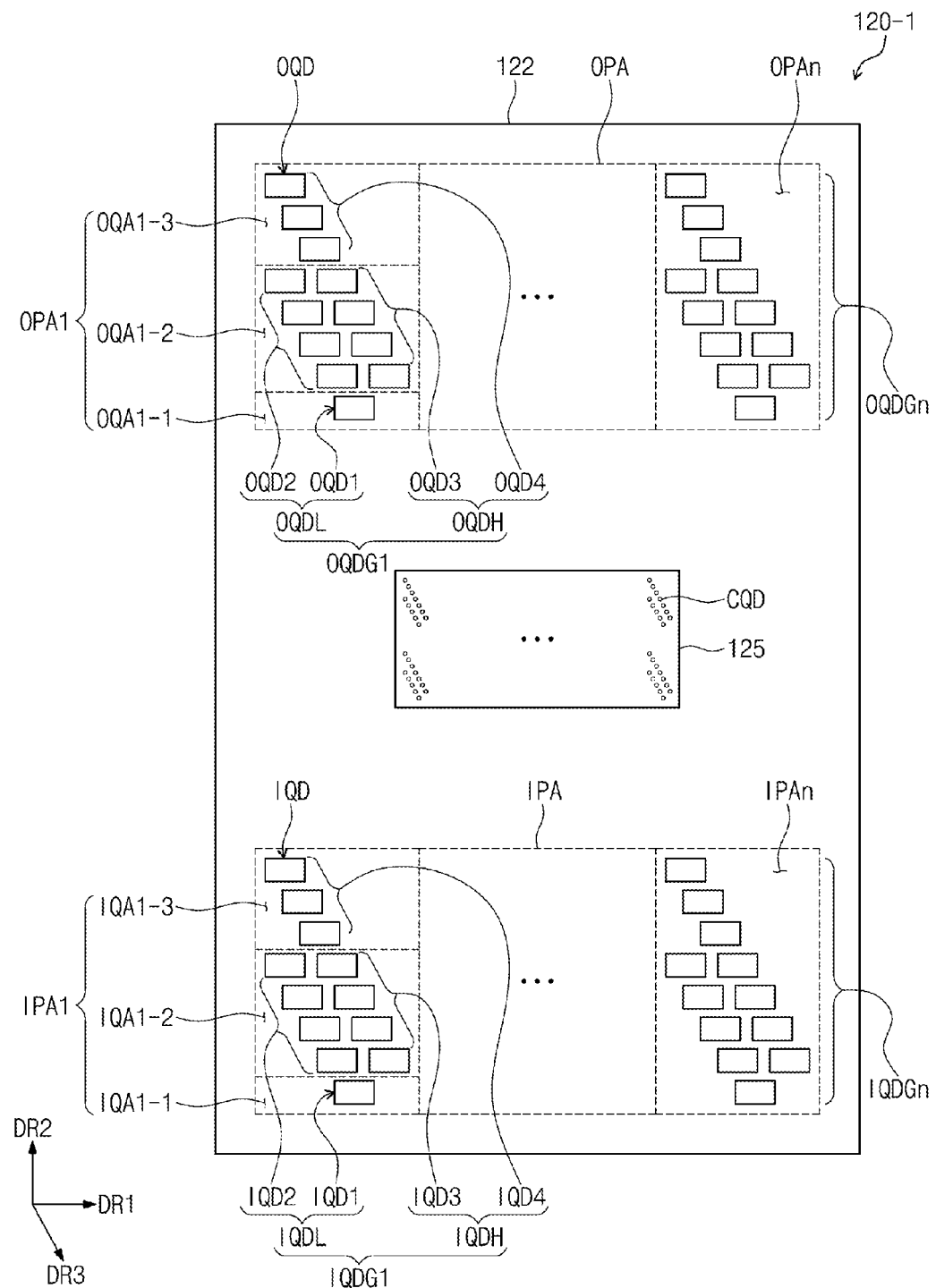
FIG. 26 is a plan view of a flexible printed circuit board according to another embodiment of the inventive concept.

FIG. 26 is a plan view of a flexible printed circuit board according to another embodiment of the inventive concept.

When comparing the flexible printed circuit board 120 of FIG. 3, a flexible printed circuit board 120-1 of FIG. 26 may include pads having different shapes. Hereinafter, discussion will mainly focus on those differences between the flexible printed circuit board 120-1 of FIG. 26 and the flexible printed circuit board 120 of FIG. 3.

The flexible line board 122 may include a plurality of pads OQD, IQD, and CQD and a plurality of lines (not shown).

The plurality of pads OQD, IQD, and CQD may include connection pads CQD connected to connection terminals (not shown) of the driving circuit chip 125, input pads IQD connected to the main driving board 130, and output pads OQD connected to the display panel 110.

The input pads IQD may be divided into a plurality of input pad groups IQDG1 to IQDGn. Each input pad group IQDG1 to IQDGn may have the same pad arrangement.

Hereinafter, a pad arrangement structure in which one output pad group OQDG1 is disposed within one output pad group area OQA1 will be described as an example.

The output pad group OQDG1 may include first row output pads OQDL and second row output pads OQDH.

The first row output pads OQDL and the second row output pads OQDH may be provided in numbers different from each other. In FIG. 26, a structure in which five first row output pads OQDL are provided, and seven second row output pads OQDH are provided, is illustrated as an example.

The output pad group area OPA1 may be divided into first to third output pad areas OQA1-1, OQA1-2, and OQA1-3.

The first to third output pad areas OQA1-1, OQA1-2, and OQA1-3 may be sequentially disposed in the second direction DR2.

The first to third output pad areas OQA1-1, OQA1-2, and OQA1-3 may have areas different from each other. FIG. 26 illustrates the output pad group area OPA1 having a condition expressed as follows: area of first output pad area OQA1-1<area of third output pad area OQA1-3<area of second output pad area OQA1-2.

A structure in which one first row output pad OQD1 is disposed within one first output pad area OQA1-1 is exemplarily illustrated in FIG. 26. Also, a structure in which four first row output pads OQD2 and four second row output pads OQD3 are disposed within the second output pad area OQA1-2 is illustrated as an example. Also, a structure in which three second row output pads OQD4 are disposed within third output pad area OQA1-3 is exemplarily illustrated as an example.

In FIG. 26, the first row output pads OQDL may have the same shape, and the second row output pads OQDH may have the same shape. However, the embodiment of the inventive concept is not limited thereto. For example, to optimally design lengths of the output pad group area OPA1 in the first and second directions DR1 and DR2, each of the first row output pads OQDL and each of the second row output pads OQDH may have various shapes.

Each of the input pads IQD may have a structure similar to that of each of the output pads OQD. Hereinafter, a pad arrangement of one input pad group IQDG1 disposed within one input pad group area IPA1 will be described, and other pad groups may have a similar arrangement.

The input pad groups IQDG1 may include first row input pads IQDL and second input pads IQDH. The input pad group area IPA1 may be divided into first to third input pad areas IQA1-1, IQA1-2, and IQA1-3. The first to third input pad areas IQA1-1, IQA1-2, and IQA1-3 may be sequentially arranged in the second direction DR2.

The first row output pads IQDL and the second row output pads IQDH may be provided in numbers different from each other. In FIG. 26, a structure in which five first row output pads IQDL are provided, and seven second row output pads IQDH are provided, is illustrated as an example.

In the printed circuit board 120-1 of FIG. 26 according to a further embodiment of the inventive concept, the output pad group area OPA1 or the input pad group area IPA1 may be reduced in length in the second direction DR2, and the pads may be efficiently disposed within the output pad group area OPA1 or the input pad group area IPA1.

In the display apparatus according to the embodiments of the inventive concept, the area occupied by pads of each of the printed circuit board and the display panel may be reduced.

In the display apparatus according to the embodiments of the inventive concept, more pads may be disposed on the limited area of each of the printed circuit board and the display panel.

In the display apparatus according to the embodiments of the inventive concept, the phenomenon in which the flexible line board and the display panel are twisted when the bonding process is performed may be prevented.

The modifications or changes made without departing from the spirit and scope of the inventive concept are evident to a person having ordinary skill in the art to which the inventive concept pertains. Hence, all changes, modifications, or alterations should therefore be seen as within the scope of the invention. Various features of the above described and other embodiments can thus be mixed and matched in any manner, to produce further embodiments consistent with the invention.

What is claimed is:

1. A printed circuit board comprising:
    a base substrate having two sides respectively extending in first and second directions and on which a plurality of pad group areas are successively positioned along the first direction;
    first row pads disposed within each of the pad group areas and successively positioned along a third direction; and
    second row pads disposed within each of the pad group areas, successively positioned along the third direction, and spaced apart from the first row pads,
    wherein each of the pad group areas is divided into first to third pad areas that are sequentially disposed along the second direction, and
    a portion of the first row pads is disposed in the first pad area, the rest of the first row pads and a portion of the second row pads are disposed in the second pad area, and the rest of the second row pads are disposed in the third pad area.

2. The printed circuit board of claim 1, wherein each of the second row pads is spaced apart from a corresponding one of the first row pads by a predetermined distance.

3. The printed circuit board of claim 1, wherein the first row pads and the second row pads are disposed on the same layer.

4. The printed circuit board of claim 1, further comprising:
    via lands disposed on a first surface of the base substrate;
    via patterns overlapping the via lands and passing through the base substrate; and
    a driving circuit chip disposed on a second surface of the base substrate, the second surface facing the first surface, the driving circuit chip being electrically connected to the first row pads and the second row pads,
    wherein the first row pads are disposed on the second surface of the base substrate, and
    the second row pads are disposed to overlap corresponding ones of the via patterns on the second surface of the base substrate, and each of the second row pads is electrically connected to the driving circuit chip through one of the via lands and one of the via patterns.

5. The printed circuit board of claim 4, wherein each of the second row pads has an area greater than that of its corresponding one via land.

6. The printed circuit board of claim 4, further comprising:
    first lines disposed on the second surface of the base substrate to connect respective first row pads to the driving circuit chip; and
    second lines configured to connect respective via lands to the driving circuit chip,
    wherein the second lines comprise:
    second upper lines disposed on the first surface of the base substrate and respectively connected to the via lands;
    second lower lines disposed on the second surface of the base substrate and connected to the driving circuit chip; and
    second via patterns passing through the base substrate to connect ones of the second upper lines to respective ones of the second lower lines.

7. The printed circuit board of claim 1, wherein one first row pad and one second row pad, that are both disposed at the same position along the first direction, also have the same shape.

8. The printed circuit board of claim 1, wherein one first row pad of the first row pads has a first shape, and another first row pad of the first row pads has a second shape different from the first shape.

9. The printed circuit board of claim 8, wherein each of the first and second shapes has a rectangular shape,
    a length of the second shape in the first direction is less by a first length than that of the first shape in the first direction, and
    a length of the second shape in the second direction is greater by the first length than that of the first shape in the second direction.

10. The printed circuit board of claim 9, wherein the first row pads disposed within each of the pad group areas sequentially comprise first- to n-th first row pads, and the first-first row pad or the n-th first row pad has the second shape.

11. The printed circuit board of claim 1, wherein the number of first row pads disposed on a first pad group area of the pad group areas is different from that of second row pads disposed on the first pad group area.

12. The printed circuit board of claim 11, wherein the first to third pad areas have areas different from each other.

13. A display apparatus comprising:
    a printed circuit board having two sides respectively extending in first and second directions and on which a plurality of pad group areas are successively positioned along the first direction; and
    a display panel electrically connected to the printed circuit board through the pad group areas,
    wherein the printed circuit board comprises:
    first row pads disposed within each of the pad group areas and successively positioned along a third direction; and
    second row pads disposed within each of the pad group areas, successively positioned along the third direction, and spaced apart from the first row pads,
    wherein each of the pad group areas is divided into first to third pad areas that are sequentially disposed along the second direction, and
    a portion of the first row pads is disposed in the first pad area, the rest of the first row pads and a portion of the second row pads are disposed in the second pad area, and the rest of the second row pads are disposed in the third pad area.

14. The display apparatus of claim 13, wherein the display panel comprises:
    first row panel pads overlapping respective first row pads; and
    second row panel pads overlapping respective second row pads,
    wherein a portion of the first row panel pads is disposed on the first pad area, the rest of the first row panel pads and a portion of the second row panel pads are disposed on the second pad area, and the rest of the second row panel pads are disposed on the third pad area.

15. The display apparatus of claim 14, wherein the first row pads cover respective first row panel pads, and
    the second row pads cover respective second row panel pads.

16. The display apparatus of claim 14, wherein the display panel further comprises:
    first row panel lines connected to respective first row panel pads; and
    second row panel lines connected to respective second row panel pads, wherein ones of the first row panel lines and ones of the second row panel lines are disposed in alternating manner along the first direction.

* * * * *